US012720866B2

(12) United States Patent
Rao et al.

(10) Patent No.: US 12,720,866 B2
(45) Date of Patent: Aug. 25, 2026

(54) DISPLAY PANEL AND DISPLAY DEVICE

(71) Applicant: Wuhan Tianma Micro-Electronics Co., Ltd., Wuhan (CN)

(72) Inventors: Ruiheng Rao, Wuhan (CN); Hao Dai, Wuhan (CN); Yangzhao Ma, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 433 days.

(21) Appl. No.: 18/241,435

(22) Filed: Sep. 1, 2023

(65) Prior Publication Data

US 2024/0395826 A1 Nov. 28, 2024

(30) Foreign Application Priority Data

May 23, 2023 (CN) ......................... 202310604476.5

(51) Int. Cl.
*H10D 86/60* (2025.01)
*H10D 86/40* (2025.01)

(52) U.S. Cl.
CPC ........... *H10D 86/60* (2025.01); *H10D 86/441* (2025.01)

(58) Field of Classification Search
CPC .... H10D 86/60; H10D 86/441; H10K 59/131; H10K 59/60
See application file for complete search history.

(56) References Cited

U.S. PATENT DOCUMENTS

2020/0176542 A1* 6/2020 Park ..................... H10K 59/131
2020/0176657 A1* 6/2020 Jang ...................... G06F 1/1626
2021/0125546 A1* 4/2021 Fei .......................... G09G 3/20
2021/0391408 A1* 12/2021 Lee ...................... H10K 59/131
2022/0045159 A1* 2/2022 Lee ...................... H10K 59/121
2022/0320230 A1* 10/2022 Zhang ................ H10K 59/1216

FOREIGN PATENT DOCUMENTS

CN 108919581 A 11/2018
CN 110610667 A 12/2019

* cited by examiner

*Primary Examiner* — Christine S. Kim
*Assistant Examiner* — Nathalie R Fayette
(74) *Attorney, Agent, or Firm* — Anova Law Group, PLLC

(57) ABSTRACT

Display panel and display device are provided. The display panel includes at least one light-transmitting area and a display area surrounding the at least one light-transmitting area. The display area includes a plurality of data lines including first data lines, a first data line includes a first subsection, a second subsection, and a connection line connecting the first subsection and the second subsection, first subsections and second subsections are respectively on two sides of a light-transmitting area along a first direction, connection lines at least partially surround the light-transmitting area, and the connection lines are in the display area. The connection line includes a first connection line and a second connection line on different film layers.

18 Claims, 17 Drawing Sheets

DISPLAY PANEL AND DISPLAY DEVICE

CROSS-REFERENCE TO RELATED APPLICATION

This application claims priority of Chinese Patent Application No. 202310604476.5, filed on May 23, 2023, the entire contents of which are hereby incorporated by reference.

FIELD OF THE DISCLOSURE

The present disclosure generally relates to the field of display technology and, more particularly, relates to a display panel and a display device.

BACKGROUND

In existing display devices, due to a need to integrate a front-facing camera, a fingerprint recognition element, an infrared sensing element or the like, a hole is dug on a display panel to form a light-transmitting area. External light can enter a photosensitive component under the display panel through the light-transmitting area on the display panel.

Since signal lines around the light-transmitting area need to be connected around the light-transmitting area, a wider frame needs to be arranged around the light-transmitting area to provide enough space for wiring, which affects a screen-to-body ratio of the display panel and cannot meet a market's demand for a narrow frame.

BRIEF SUMMARY OF THE DISCLOSURE

One aspect of the present disclosure provides a display panel. The display panel includes at least one light-transmitting area and a display area surrounding the at least one light-transmitting area. The display area includes a plurality of data lines including first data lines, a first data line includes a first subsection, a second subsection, and a connection line connecting the first subsection and the second subsection, first subsections and second subsections are respectively on two sides of a light-transmitting area along a first direction, connection lines at least partially surround the light-transmitting area, and the connection lines are in the display area. The connection line includes a first connection line and a second connection line on different film layers.

Another aspect of the present disclosure provides a display device including a display panel. The display panel includes at least one light-transmitting area and a display area surrounding the at least one light-transmitting area. The display area includes a plurality of data lines including first data lines, a first data line includes a first subsection, a second subsection, and a connection line connecting the first subsection and the second subsection, first subsections and second subsections are respectively on two sides of a light-transmitting area along a first direction, connection lines at least partially surround the light-transmitting area, and the connection lines are in the display area. The connection line includes a first connection line and a second connection line on different film layers.

Other aspects of the present disclosure can be understood by a person skilled in the art in light of the description, the claims, and the drawings of the present disclosure.

BRIEF DESCRIPTION OF THE DRAWINGS

Accompanying drawings, which are incorporated into and constitute a part of the present specification, illustrate embodiments of the present disclosure and together with the description, serve to explain principles of the present disclosure.

DETAILED DESCRIPTION

Various exemplary embodiments of the present disclosure will be described in detail with reference to the accompanying drawings. It should be noted that, unless specifically stated otherwise, a relative arrangement of components and steps, numerical expressions and numerical values set forth in the embodiments do not limit the scope of the present disclosure.

The following description of at least one exemplary embodiment is merely illustrative and is not intended to limit the present disclosure and application or use thereof.

Techniques, methods, and apparatus known to a person skilled in the art may not be discussed in detail, but where appropriate, such techniques, methods, and apparatus should be considered as part of the present specification.

In all examples shown and discussed herein, any specific value should be construed as illustrative only and not as a limitation. Accordingly, other examples of exemplary embodiments may have different values.

It should be noted that similar numerals and letters refer to similar items in the following accompanying drawings. Once an item is defined in one accompanying drawing, the item does not require further discussion in subsequent accompanying drawings.

Figure 1:
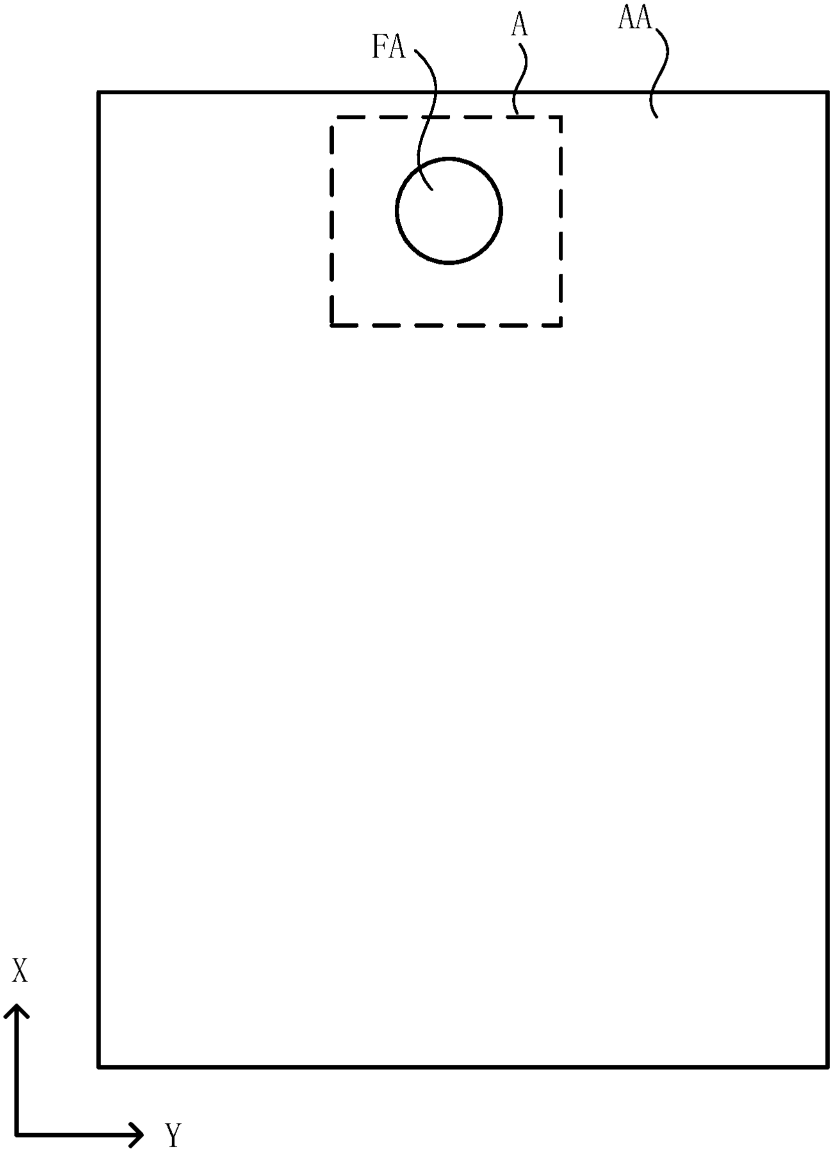
FIG. 1 illustrates a planar view of a display panel consistent with various embodiments of the present disclosure.
Figure 2:
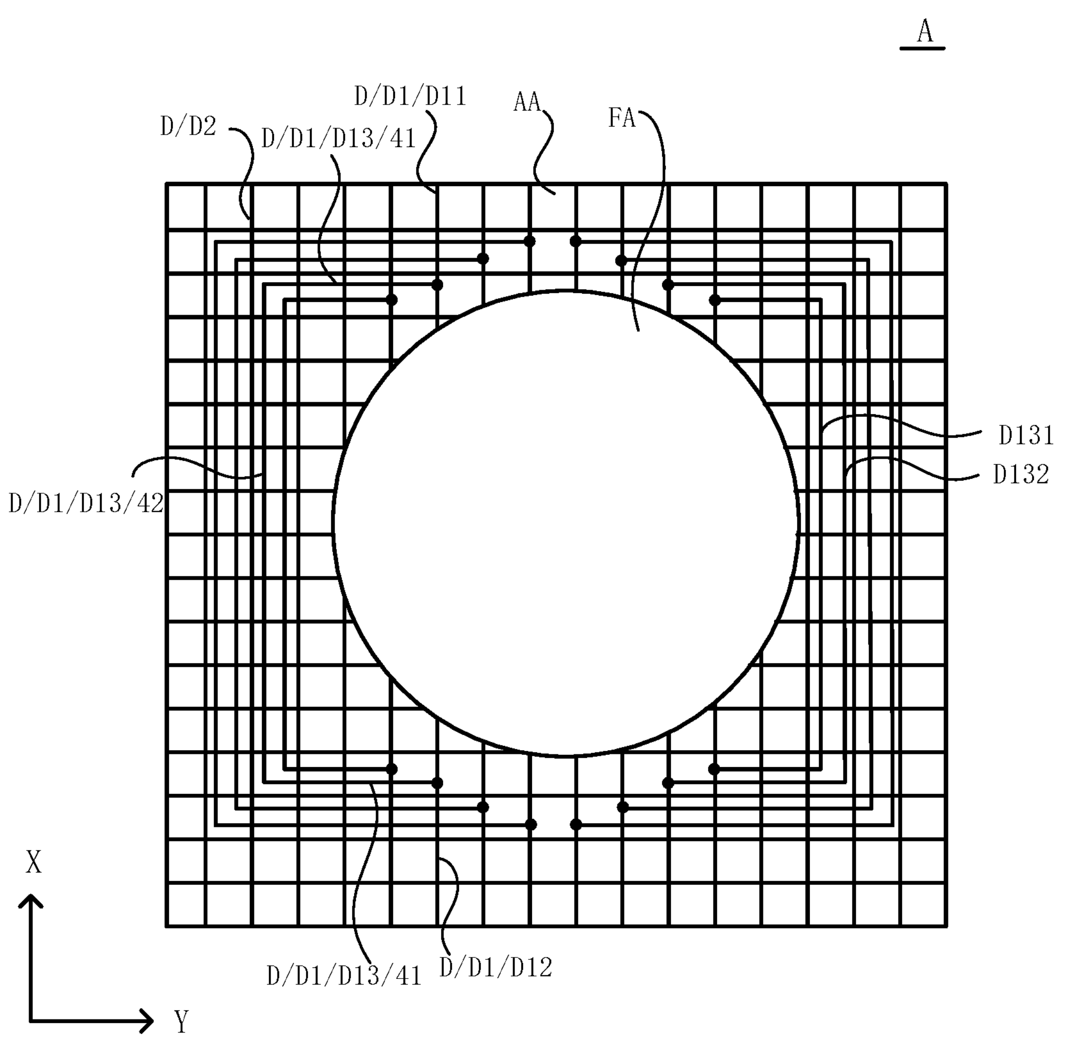
FIG. 2 illustrates an enlarged schematic diagram of part A of the display panel described in FIG. 1.

FIG. 1 illustrates a planar view of a display panel consistent with various embodiments of the present disclosure. FIG. 2 illustrates an enlarged schematic diagram of part A of the display panel described in FIG. 1. Referring to FIG. 1 and FIG. 2, in one embodiment, a display panel includes at least one light-transmitting area FA and a display area AA surrounding the light-transmitting area FA. A light transmittance of the light-transmitting area FA is relatively high, so that an area corresponding to the light-transmitting area FA can be used to place a photosensitive element. The photosensitive element can be a camera, a light sensor, a distance sensor, a depth sensor, an iris recognition sensor, an infrared sensor, or the like, which is not limited herein.

Optionally, the light-transmitting area FA may be a non-display area, that is, the light-transmitting area FA does not emit light, to reduce an impact on performance of the photosensitive element.

It should be noted that the light-transmitting area FA can be a rectangular area, a circular area, an elliptical area, or the like. A position of the light-transmitting area FA can be arranged on any side of the display panel. A person skilled in the art can arrange a shape and the position of the light-transmitting area FA according to actual needs, which is not limited herein.

The display area AA includes a plurality of data lines D including a first data line D1. The first data line D1 includes a first subsection D11, a second subsection D12, and connection lines D13 connecting the first subsection D11 and the second subsection D12. The first subsection D11 and the second subsection D12 are respectively on two sides of the light-transmitting area FA along a first direction X. The first subsection D11 and the second subsection D12 extend until the light-transmitting area FA stops, and the first subsection D11 and the second subsection D12 are connected by arranging the connection lines D13. That is, virtual extension lines of the first subsection D11 and the second subsection D12 extend through the light-transmitting area FA. The connection lines D13 partially surround the light-transmitting area FA, and the connection lines D13 are in the display area AA. That is, the connection lines D13 do not need to be wound from a frame position of the light-transmitting area FA, thereby reducing number of signal lines at the frame position of the light-transmitting area FA, reducing a frame area of the light-transmitting area FA, and increasing a screen-to-body ratio of the display panel.

The connection lines D13 include first connection lines D131 and second connection lines D132 on different film layers. That is, the first connection lines D131 and the second connection lines D132 are respectively arranged on different film layers of the display panel, which is conducive to arranging a larger number of connection lines D13 in the display area AA, reducing number of signal lines at the frame position of the light-transmitting area FA, reducing a frame area of the light-transmitting area FA and increasing the screen-to-body ratio of the display panel. At a same time, the first connection lines D131 and the second connection lines D132 are on different film layers, which is conducive to reducing number of connection lines D13 on a same film layer and increasing a distance between adjacent connection lines D13 arranged on the same film layer, reducing a coupling capacitance formed between adjacent connection lines D13 arranged on the same film layer, improving a signal crosstalk problem between the adjacent connection lines D13 arranged on the same film layer, and improving a display effect of the display panel.

Figure 3:
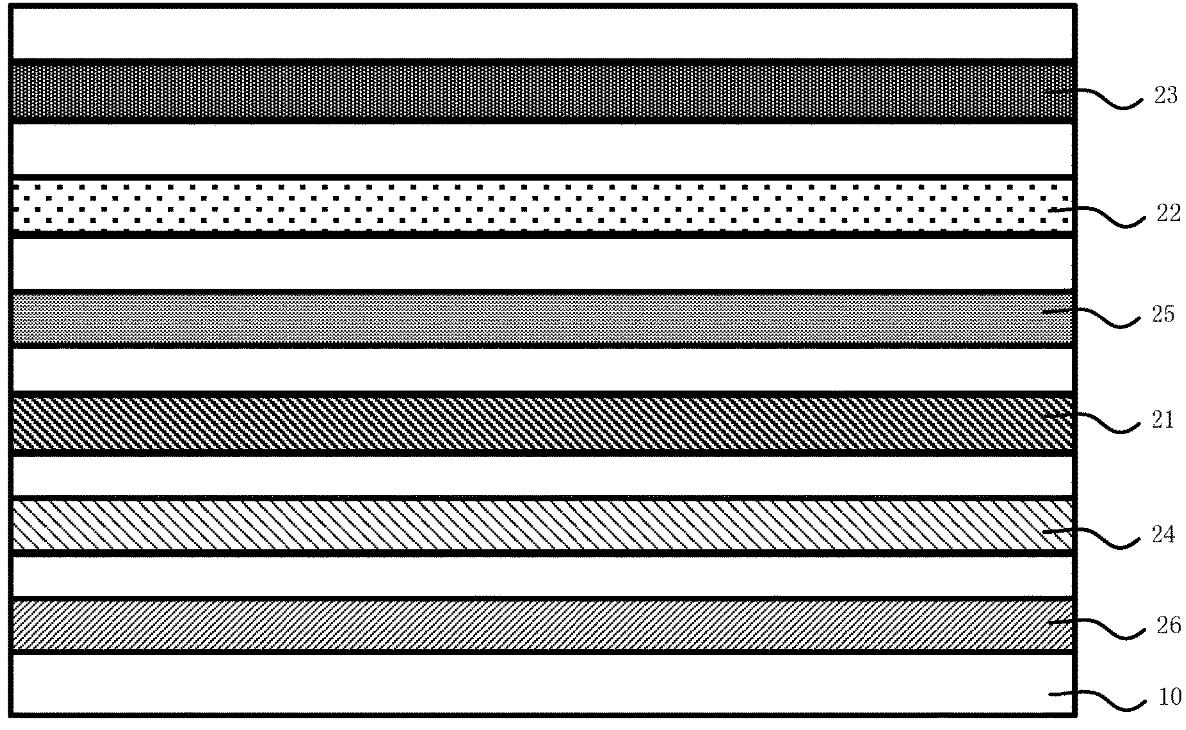
FIG. 3 illustrates a schematic diagram of a film layer of a display panel consistent with various embodiments of the present disclosure.

FIG. 3 illustrates a schematic diagram of a film layer of a display panel consistent with various embodiments of the present disclosure. Referring to FIGS. 1-3, In some optional embodiments, the display panel includes a base substrate 10, and a first metal layer 21, a second metal layer 22 and a third metal layer 23 arranged in sequence on a side of the base substrate 10. The first subsections D11 and the second subsections D12 are on the second metal layer 22, the first connection lines D131 are on the first metal layer 21, and the second connection lines D132 are on the third metal layer 23.

Specifically, the display panel includes the base substrate 10, the first metal layer 21, the second metal layer 22 and the third metal layer 23. The first subsections D11 and the second subsections D12 of the first data lines D1 are arranged on the second metal layer 22, the first connection lines D131 are arranged on the first metal layer 21, and the second connection lines D132 are arranged on the third metal layer 23, so that the first connection lines D131 and the second connection lines D132 are arranged on different film layers. The second metal layer 22 is on a side of the first metal layer 21 away from the base substrate 10, and the third metal layer 23 is on a side of the second metal layer 22 away from the base substrate. That is, along a direction perpendicular to a plane where the base substrate 10 is located, the first metal layer 21 and the third metal layer 23 are on two sides of the second metal layer 22. Therefore, arranging the first connection lines D131 on the first metal layer 21 and arranging the second connection lines D132 on the third metal layer 23 are conducive to reducing coupling capacitances between the first connection lines D131 and the second connection lines D132.

Optionally, the data line D further includes a second data line D2 extending along the first direction X, that is, the second data line D2 is a normal data line. The second data line D2 is not designed to be wound around the light-transmitting area FA, and the second data line D2 is not interrupted by the light-transmitting area FA, so that the second data line D2 extends along the first direction X. The second data line D2 is arranged on the second metal layer 22, the first connection lines D131 are arranged on the first metal layer 21, and the second connection lines D132 are arranged on the third metal layer 23, to avoid affecting an arrangement of the second data lines D2 when the first connection lines D131 and the second connection lines D132 are arranged in the display area AA.

Figure 4:
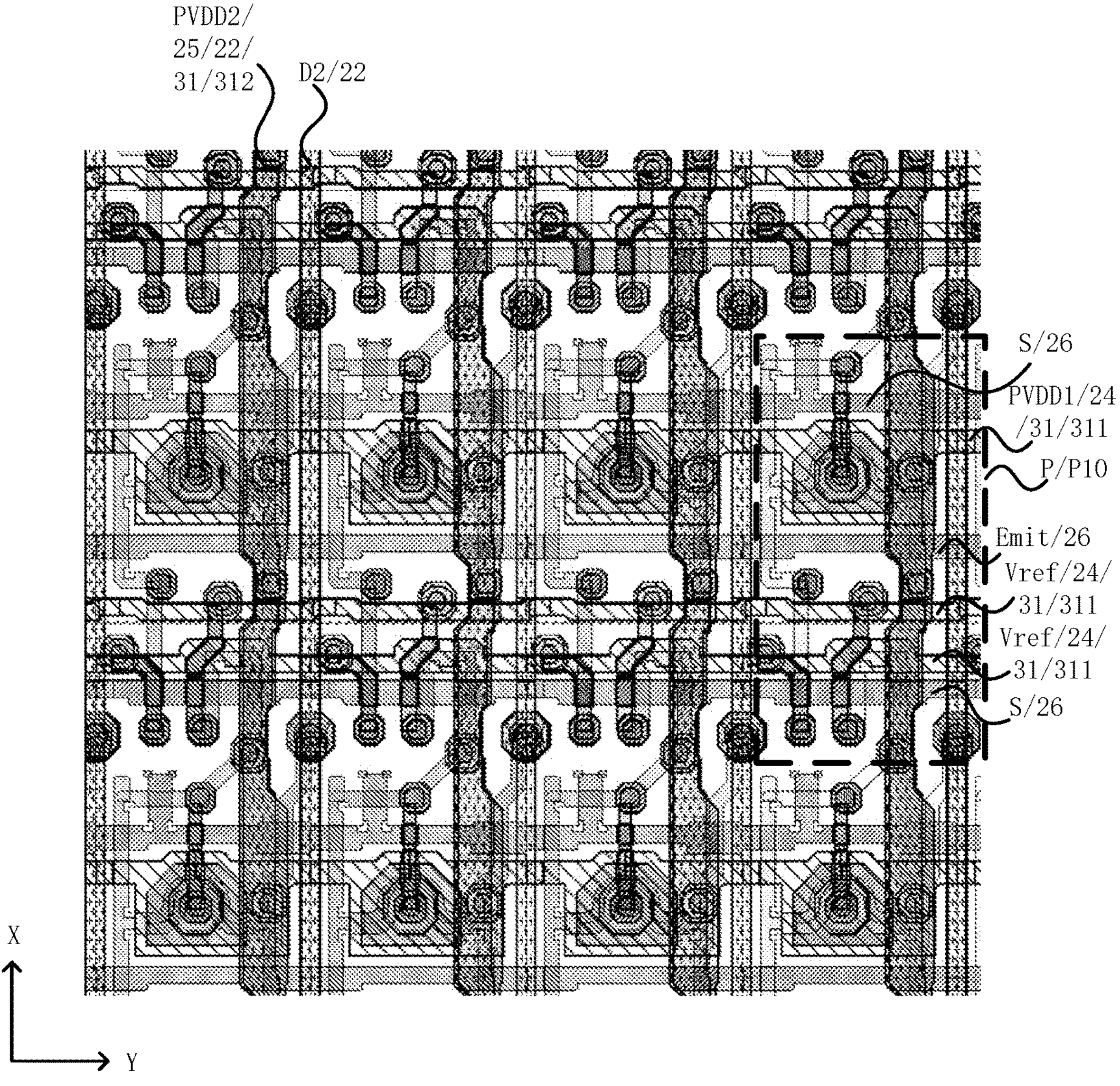
FIG. 4 illustrates a partial layout of a display area in a display panel consistent with various embodiments of the present disclosure.

FIG. 4 illustrates a partial layout of a display area in a display panel consistent with various embodiments of the present disclosure. Referring to FIGS. 1-4, in some optional embodiments, the display area AA includes a plurality of subpixels P. A subpixel P includes an electrically connected pixel circuits P10 and light-emitting elements (not shown). The pixel circuits P10 are configured to drive the light emitting elements electrically connected to the pixel circuits P10 to emit light to realize a display function.

The display panel also includes a plurality of scanning lines S, a plurality of light emission control signal lines Emit, a plurality of reference voltage signal lines Vref and a plurality of first branch lines PVDD1. The plurality of first branch lines PVDD1 are connected to power supply voltage signals. The plurality of scanning lines S, the plurality of light emission control signal lines Emit, the plurality of reference voltage signal lines Vref and the first branch line PVDD1 all extend along a second direction Y. The first direction X intersects the second direction Y.

The display panel further includes a plurality of second branch lines PVDD2 connected to power voltage signals. The plurality of second branch lines PVDD2 extends along the first direction X.

The plurality of scanning lines S, the plurality of light emission control signal lines Emit, the plurality of reference voltage signal lines Vref, the plurality of first branch lines PVDD1 and the plurality of second branch lines PVDD2 are electrically connected to the pixel circuits P10 to provide corresponding signals to the pixel circuits P10. Specifically, the plurality of scan lines S is configured to provide scan signals to the pixel circuits P10. The plurality of light emission control signal lines Emit is configured to provide light emission control signals to the pixel circuits P10. The plurality of reference voltage signal lines Vref is configured to provide reference voltage signals to the pixel circuits P10. The plurality of first branch lines PVDD1 and the plurality of second branch lines PVDD2 are configured to provide power supply voltage signals to the pixel circuits P10.

The display panel further includes a fourth metal layer 24, a fifth metal layer 25 and a sixth metal layer 26. The fifth metal layer 25 is between the first metal layer 21 and the second metal layer 22. The sixth metal layer 26 is on a side of the first metal layer 21 close to the base substrate 10. The fourth metal layer 24 is between the first metal layer 21 and the sixth metal layer 26. The metal layers between the first metal layer 21 to the sixth metal layer 26 are insulated from each other.

The plurality of emission control signal lines Emit and the plurality of scan lines S are on the sixth metal layer 26, the plurality of reference voltage signal lines Vref and the plurality of first branch lines PVDD1 are on the fourth metal layer 24, and the plurality of second branch lines PVDD2 is on the fifth metal layer 25.

It should be noted that FIG. 4 only exemplarily shows a partial structural layout of a pixel circuit. The pixel circuit shown in FIG. 4 may also include other structures. In other embodiments, the display panel may also use other pixel circuits, which is not repeated herein.

Figure 5:
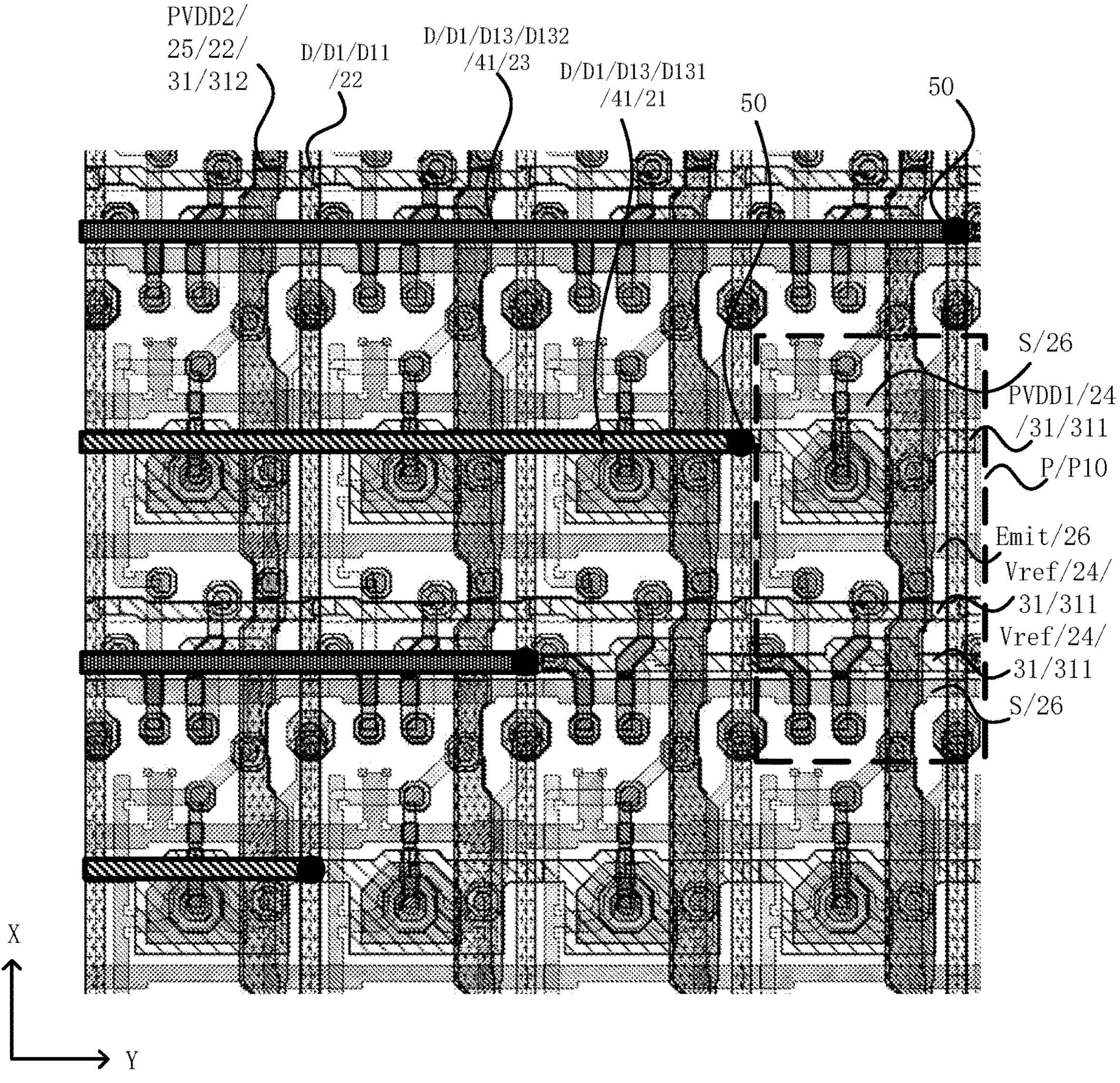
FIG. 5 illustrates another partial layout of a display area in a display panel consistent with various embodiments of the present disclosure.

FIG. 5 illustrates another partial layout of a display area in a display panel consistent with various embodiments of the present disclosure. Referring to FIG. 1, FIG. 3, and FIG. 5, in some optional embodiments, the display area AA includes a plurality of pixel circuits P10 and a plurality of signal lines 30 electrically connected to the plurality of pixel circuits P10. The plurality of signal lines 30 are configured to transmit signals to the plurality of pixel circuits P10 electrically connected to the plurality of signal lines 30. The display area AA also includes a plurality of light-emitting elements (not shown). The plurality of pixel circuits P10 is arranged corresponding to the plurality light-emitting elements, and the plurality of pixel circuit P10 is configured to drive the corresponding light-emitting elements to emit light to realize a display function.

The plurality of signal lines 30 includes power signal lines 31. A power line 31 is configured to transmit a power supply voltage signal to the pixel circuit P10 electrically connected to the power signal line 31 or transmit a fixed voltage signal to the pixel circuit P10 electrically connected to the power signal line 31, or continuously transmit a fixed voltage signal to the pixel circuit P10 electrically connected to the power signal line 31 at a certain stage.

The connection lines D13 and the power signal lines 31 are on different film layers, and the connection lines D13 are insulated from the power signal lines 31. Along a direction perpendicular to a plane where the display panel is located, at least one connection line D13 at least partially overlaps a power signal line 31. That is, at least part of spaces occupied by the power signal lines 31 can be multiplexed to arrange the connection lines D13, so that the connection lines D13 can be arranged in the display area AA. At least part of the spaces occupied by the power signal lines 31 is used to arrange the connection lines D13, so that an arrangement of the connection lines D13 has less influence on the pixel circuit P10 and other signal lines in the display area AA, effectively reducing an impact on a pixel density of the display panel when the connection lines D13 are arranged in the display area AA. Since the power signal lines 31 are configured to transmit power supply voltage signals or fixed voltage signals, coupling capacitances formed by overlapping parts of the connection lines D13 and the power signal lines 31 along the direction perpendicular to the plane where the display panel is located are relatively small, which is conducive to improving a signal crosstalk problem caused when the connection lines D13 are arranged in the display area AA, and display effect of the display panel.

Referring to FIG. 1, FIG. 3 and FIG. 5, in some optional embodiments, a connection line D13 includes two first segments 41 extending along the second direction Y and one second segment 42 extending along the first direction X. The two first segments 41 are electrically connected to a first subsection D11 and a second subsection D12 respectively, and the two first segments 41 are respectively connected to two ends of the second segment 42. The first direction X intersects the second direction Y. Optionally, the first direction X and the second direction Y are perpendicular to each other. That is, one end of one first segment 41 is electrically connected to the first subsection D11. The other end of the one first segment 41 is electrically connected to one end of the second segment 42, one end of the other first segment 41 is electrically connected to the second subsection D12, and the other end of the other first segment 41 is electrically connected to the other end of the second segment 42, so that the connection line D13 is connected to the first subsection D11 and the second subsection D12. The connection line D13 partially surrounds the light-transmitting area FA and is arranged in the display area AA.

The power signal lines 31 include first power signal lines 311 and second power signal lines 312. The first power signal lines 311 extend along the second direction Y, and the second power signal lines 312 extend along the first direction X.

The first segments 41 and the first power signal lines 311 are on different film layers. Along the direction perpendicular to the plane of the display panel, at least one first segment 41 at least partially overlaps the first power signal lines 311. That is, spaces occupied by the first power signal line 311 extending along the second direction Y in the reusable part can be multiplexed to arrange the first segments 41 extending along the second direction Y, so that the first segments 41 can be arranged in the display area AA. The spaces occupied by the first power signal lines 311 are multiplexed to arrange the first segments 41, so that an arrangement of the first segments 41 has less influence on the pixel circuits P10 and other signal lines in the display area AA, thereby effectively reducing an impact on the pixel density of the display panel when the first segments 41 are arranged in the display area AA. Since the first power signal lines 311 are configured to transmit power supply voltage signals or fixed voltage signals, along the direction perpendicular to the plane where the display panel is located, coupling capacitances formed by overlapping parts of the first segments 41 and the first power signal lines 311 are relatively small, which is conducive to improving a signal crosstalk problem caused when the first segments 41 of the connection lines D13 are arranged in the display area AA, and the display effect of the display panel.

Figure 6:
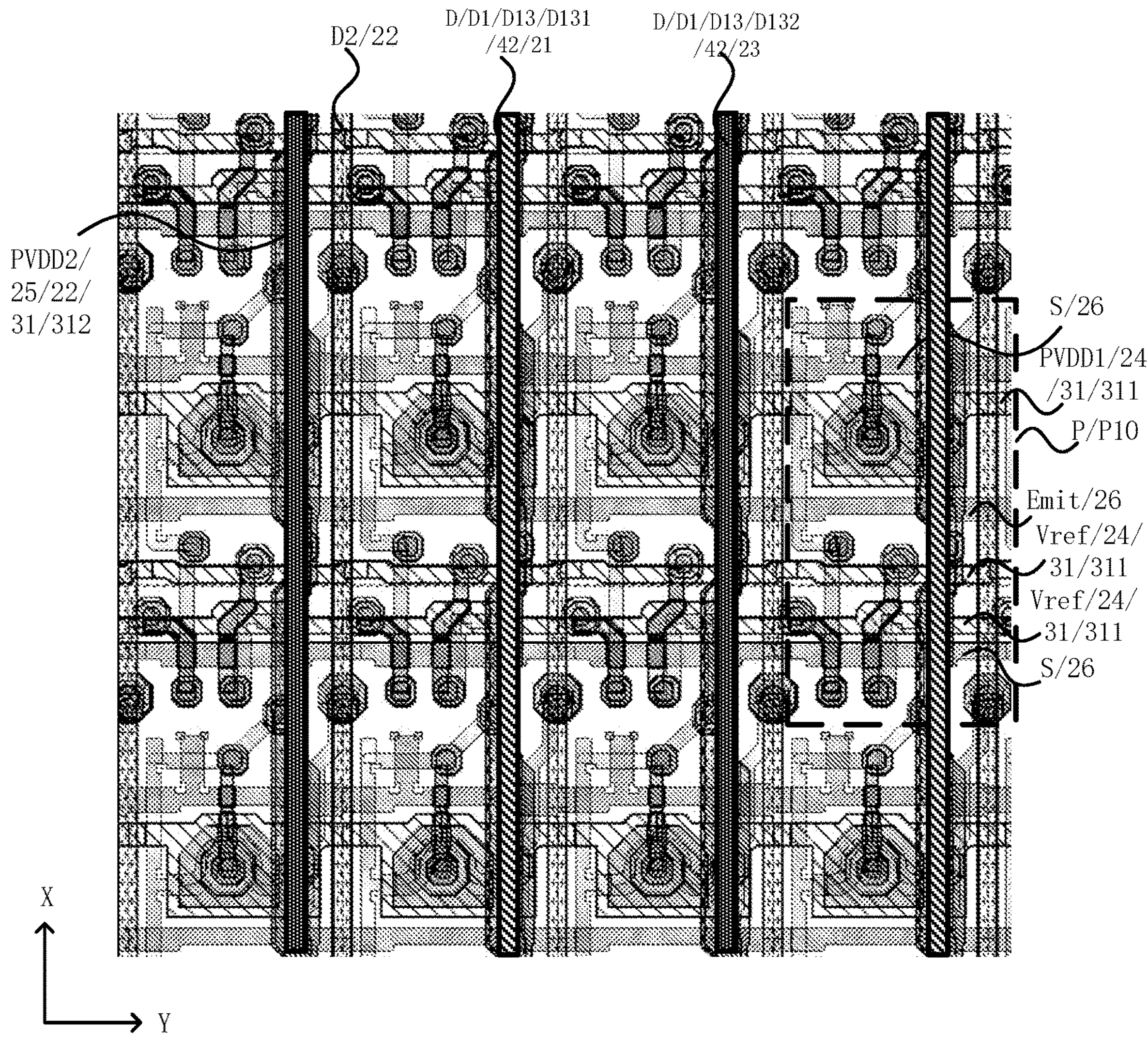
FIG. 6 illustrates another partial layout of a display area in a display panel consistent with various embodiments of the present disclosure.

FIG. 6 illustrates another partial layout of a display area in a display panel consistent with various embodiments of the present disclosure. Referring to FIGS. 1-3 and 6, in some optional embodiments, the second segments 42 and the second power signal lines 312 are on different film layers, and at least one second segment 42 at least partially overlaps the second power signal lines 312. That is, spaces occupied by the second power signal lines 312 extending along the first direction X can be multiplexed to arrange the second segments 42 extending along the first direction X, so that the second segments 42 can be arranged in the display area AA. The spaces occupied by the second power signal line 312 are multiplexed to arrange the second segments 42, so that an arrangement of the second segments 42 has less influence on the pixel circuit P10 and other signal lines in the display area AA, effectively reducing an impact on the pixel density of the display panel when the second segments 42 are arranged in the display area AA. Since the second power signal lines 312 are configured to transmit power supply voltage signals or fixed voltage signals, along the direction perpendicular to the plane where the display panel is located, coupling capacitances formed by overlapping parts of the second segments 42 and the second power signal lines 312 are relatively small, which is conducive to improving a signal crosstalk problem caused when the second segments 42 of the connection lines D13 are arranged in the display area AA, and the display effect of the display panel.

Figure 7:
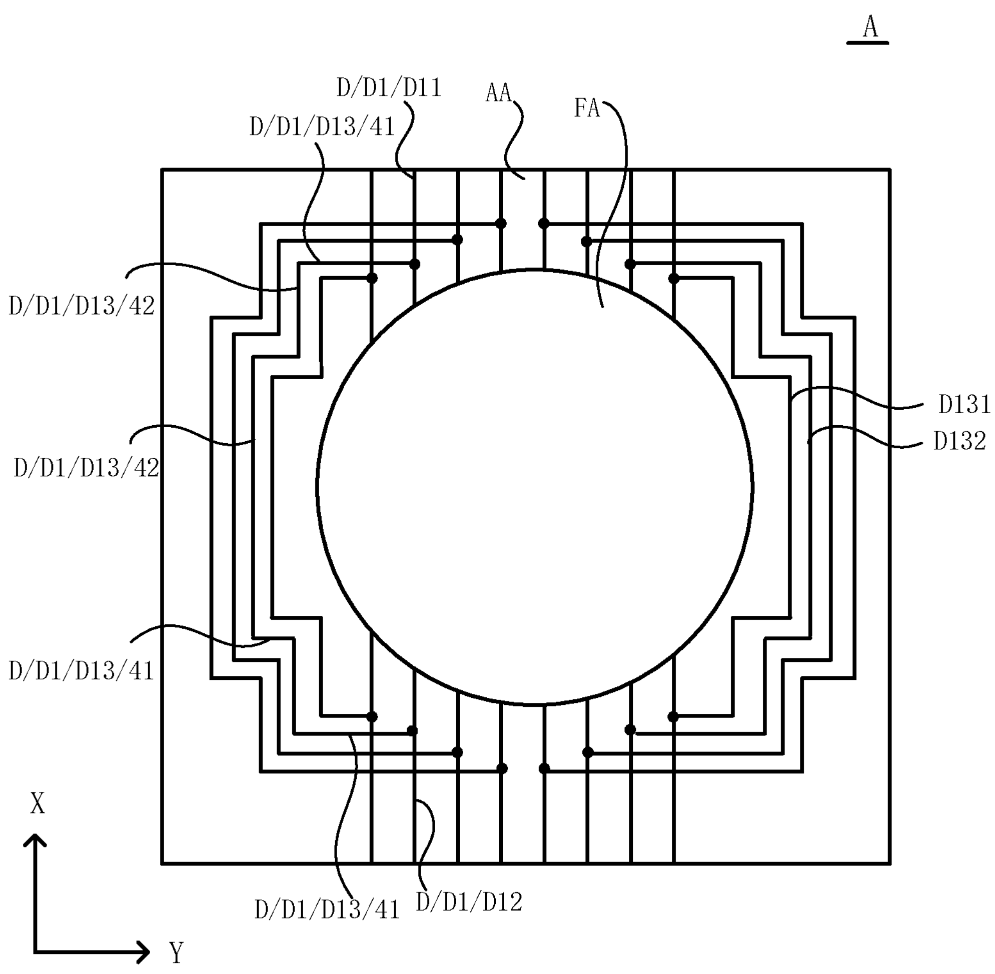
FIG. 7 illustrates another enlarged schematic diagram of part A of the display panel described in FIG. 1.

It should be noted that FIG. 2 exemplarily shows that a connection line D13 includes two first segments 41 extending along the second direction Y and one second segment 42 extending along the first direction X, the two first segments 41 are respectively electrically connected to a first subsection D11 and a second subsection D12, and the two first segments 41 are respectively connected to two ends of the second segment 42. In other embodiments, the connection line D13 may further include a plurality of first segments 41 extending along the second direction Y and a plurality of second segments 42 extending along the first direction X. FIG. 7 illustrates another enlarged schematic diagram of part A of the display panel described in FIG. 1. Exemplarily, a connection line D13 includes four first segments 41 extending along the second direction Y and three second segments 42 extending along the first direction X, so that the connection line D13 is a folded line structure with a plurality of folded corners. In other embodiments, the connection line D13 may also include other numbers of first segments 41 and second segments 42, which is not repeated herein.

It should be noted that, to clearly illustrate the structure of the connection line D13 in FIG. 7, other signal lines such as the second data lines are not shown. The display panel shown in FIG. 7 includes other signal lines such as the second data line in an actual product. In partial views of other embodiments, corresponding illustration methods may also be used, which are not repeated herein.

It should be noted that when a connection line D13 includes a plurality of first segments 41 extending along the second direction Y and a plurality of second segments 42 extending along the first direction X, for an arrangement of the first segments 41 and the second segments 42, reference may be made to the arrangement of the first segments 41 and the second segments 42 in the embodiments of the present disclosure, which is not repeated herein. Referring to FIG. 1, FIG. 3 and FIG. 5, in some optional embodiments, along the direction perpendicular to the plane where the display panel is located, the first segments 41 at least partially overlap the first power signal lines 311. That is, spaces occupied by the first power signal lines 311 extending along the second direction Y can be multiplexed to arrange the first segments 41 extending along the second direction Y, so that the first segments 41 can be arranged in the display area AA. The spaces occupied by the first power supply signal lines 311 are multiplexed to arrange the first segments 41, so that an arrangement of the first segments 41 has less influence on the pixel circuits P10 and other signal lines in the display area AA, effectively reducing an impact on the pixel density of the display panel when the first segments 41 are arranged in the display area AA. At a same time, since the first power signal lines 311 are configured to transmit power supply voltage signals or fixed voltage signals, along the direction perpendicular to the plane where the display panel is located, coupling capacitances formed by overlapping parts of the first segments 41 and the first power signal lines 311 are relatively small, which is conducive to improving a signal crosstalk problem caused when the first segments 41 of the connection lines D13 are arranged in the display area AA, and the display effect of the display panel.

Along the direction perpendicular to the plane where the display panel is located, the first segments 41 of the first connection lines D131 and the first segments 41 of the second connection lines D132 at least partially overlap different first power signal lines 311. That is, the first segments 41 of the first connection lines D131 and the first segments 41 of the second connection lines D132 can be configured by multiplexing spaces occupied by different first power signal lines 311, which is conducive to reducing coupling between the first segment 41 of the first connection lines D131 and the first segments 41 of the second connection lines D132, and improving a signal crosstalk problem between the first segments 41 of the connection lines D13, and the display effect of the display panel.

Referring to FIGS. 1-3 and 5, in some optional embodiments, the first segments 41 of the first connection lines D131 and the first segments 41 of the second connection lines D132 are arranged alternately.

Specifically, the first connection lines D131 are on the first metal layer 21, and the second connection lines D132 are on the third metal layer 23. Accordingly, the first segments 41 of the first connection lines D131 are on the first metal layer 21, and the first segments 41 of the second connection lines D132 are on the third metal layer 23, so that when the first segments 41 of the first connection lines D131 and the first segments 41 of the second connection line D132 are arranged alternately, distances between the first segments 41 of adjacent first connection lines D131 on the first metal layer 21 are relatively large, which are conducive to reducing coupling between the first segments 41 of the adjacent first connection lines D131 on the first metal layer 21, and improving a signal crosstalk problem between the first segments 41 of the adjacent first connection lines D131 on the first metal layer 21, and the display effect of the display panel.

Similarly, distances between the first segments 41 of the adjacent second connection lines D132 on the third metal layer 23 are relatively large, which are conducive to reducing a coupling between the first segments 41 in the adjacent second connection lines D132 on the third metal layer 23, and is conducive to improving a signal crosstalk problem between the first segments 41 of the adjacent second connection line D132 on the third metal layer 23, and the display effect of the display panel.

Referring to FIGS. 1-3 and 5, in some optional embodiments, the first power signal lines 311 include reference voltage signal lines Vref and first branch lines PVDD1, and the first branch line PVDD1 are connected to power supply voltage signals.

Specifically, the reference voltage signal lines Vref are configured to provide reference voltage signals to pixel circuits P10. Along the direction perpendicular to the plane where the display panel is located, at least one first segment 41 at least partially overlaps at least one reference voltage signal line Vref. That is, spaces occupied by the reference voltage signal lines Vref extending along the second direction Y are multiplexed to arrange the first segments 41 extending along the second direction Y, so that the first segments 41 can be arranged in the display area AA. The space occupied by the reference voltage signal lines Vref are multiplexed to arrange the first segments 41, so that an arrangement of the first segments 41 has less influence on the pixel circuits P10 and other signal lines in the display area AA, effectively reducing an impact on the pixel density of the display panel when the first segments 41 are disposed in the display area AA. At a same time, since the reference voltage signal lines Vref are configured to transmit reference voltage signals being fixed voltage signals, so that along the direction perpendicular to the plane where the display panel is located, coupling capacitances formed by overlapping parts of the first segments 41 and the reference voltage signal lines Vref are relatively small, which is conducive to improving a signal crosstalk problem caused when the first segments 41 of the connection lines D13 are arranged in the display area AA, and the display effect of the display panel.

The first branch lines PVDD1 are configured to provide power supply voltage signals to the pixel circuits P10. Along the direction perpendicular to the plane where the display panel is located, at least one first segment 41 at least partially overlaps at least one first branch line PVDD1. That is, spaces occupied by the first branch lines PVDD1 extending along the second direction Y can be multiplexed to arrange the first segments 41 extending along the second direction Y, so that the first segments 41 can be arranged in the display area AA. The spaces occupied by the first branch lines PVDD1 are multiplexed to arrange the first segments 41, so that an arrangement of the first segments 41 has less influence on the pixel circuits P10 and other signal lines in the display area AA, effectively reducing an impact on the pixel density of the display panel when the first segments 41 are arranged in the display area AA. At a same time, since the first branch lines PVDD1 are configured to transmit power supply voltage signals, along the direction perpendicular to the plane where the display panel is located, coupling capacitances formed by overlapping parts of the first segments 41 and the first branch lines PVDD1 are relatively small, which is conducive to improving a signal crosstalk problem caused when the first segments 41 of the connection lines D13 are arranged in the display area AA, and the display effect of the display panel.

It should be noted that FIG. 5 exemplarily shows that a pixel circuit P10 is electrically connected to two reference voltage signal lines Vref and one first branch line PVDD1. The two reference voltage signal lines Vref are arranged adjacently, and only a space occupied by one of the two reference voltage signal line Vref is multiplexed to arrange the first segments 41. In other embodiments, a pixel circuit P10 may also be electrically connected to other numbers of reference voltage signal lines Vref and other numbers of first branch lines PVDD1. Accordingly, spaces occupied by a plurality of reference voltage signal lines Vref and a plurality of first branch lines PVDD1 can also be multiplexed to arrange the first segments 41 to arrange more connection lines D13 in the display area AA. Exemplarily, spaces occupied by the two reference voltage signal lines Vref electrically connected to a same pixel circuit P10 can arrange the first segments 41. When the two reference voltage signal lines Vref are adjacent and a distance between the two reference voltage signal lines Vref is relatively small, the two first segments 41 respectively corresponding to the two reference voltage signal lines Vref can be arranged on different film layers. In other embodiments, other wiring methods can also be applied, which are not repeated herein.

Referring to FIG. 1, FIG. 3, and FIG. 5, in some optional embodiments, the display panel further includes a fourth metal layer 24 between the base substrate 10 and the first metal layer 21.

Both the reference voltage signal lines Vref and the first branch lines PVDD1 are on the fourth metal layer 24, the first connection lines D131 are on the first metal layer 21. Accordingly, the first segments 41 of the first connection lines D131 are on the first metal layer 21, so that the first segments 41 of the first connection lines D131 are insulated from the reference voltage signal lines Vref and the first branch lines PVDD1. Spaces occupied by the reference voltage signal lines Vref and/or the first branch lines PVDD1 can be multiplexed to arrange the first segments 41 of the first connection lines D131. The second connection lines D132 are on the third metal layer 23. Accordingly, the first segments 41 of the second connection lines D132 are on the third metal layer 23, so that the first segments 41 of the second connection lines D132 are insulated from the reference voltage signal lines Vref and the first branch lines PVDD1, and the spaces occupied by the reference voltage signal lines Vref and/or the first branch lines PVDD1 can be multiplexed to arranged the first segments 41 of the second connection lines D132.

Referring to FIG. 1, FIG. 3, and FIG. 5, in some optional embodiments, the first segments 41 are electrically connected to the first subsections D11 or the second subsections D12 through via holes 50. A vertical projection of a via hole 50 on the plane where the base substrate 10 is within a vertical projection of a reference voltage signal line Vref or a first branch line PVDD1 on the plane where the base substrate 10 is located.

Specifically, a first segment 41 is electrically connected to a first subsection D11 or a second subsection D12 through a via hole 50, to realize an electrical connection between the first subsection D11, the second subsection D12 and the connection line D13. When the first segment 41 multiplexes a space occupied by a reference voltage signal line Vref, a vertical projection of the via hole 50 corresponding to the first segment 41 on the plane where the base substrate 10 is located within a vertical projection of the reference voltage signal line Vref on the plane where the base substrate 10 is located. Similarly, when the first segment 41 multiplexes a space occupied by a first branch line PVDD1, the vertical projection of the via hole 50 corresponding to the first segment 41 on the plane where the base substrate 10 is located within a vertical projection of the first branch line PVDD1 on the plane where the base substrate 10 is located.

Figure 8:
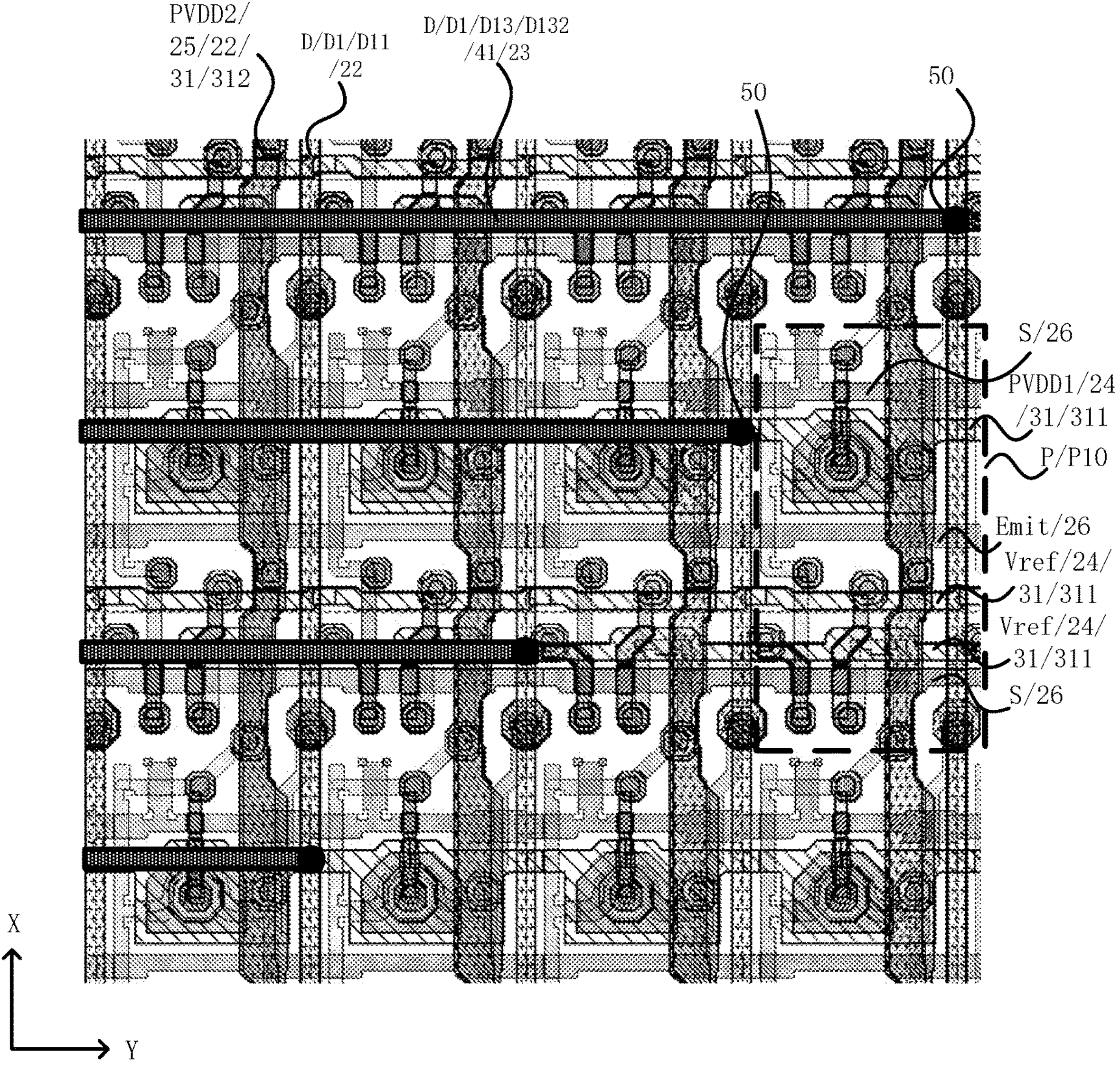
FIG. 8 illustrates another partial layout of a display area in a display panel consistent with various embodiments of the present disclosure.
Figure 9:
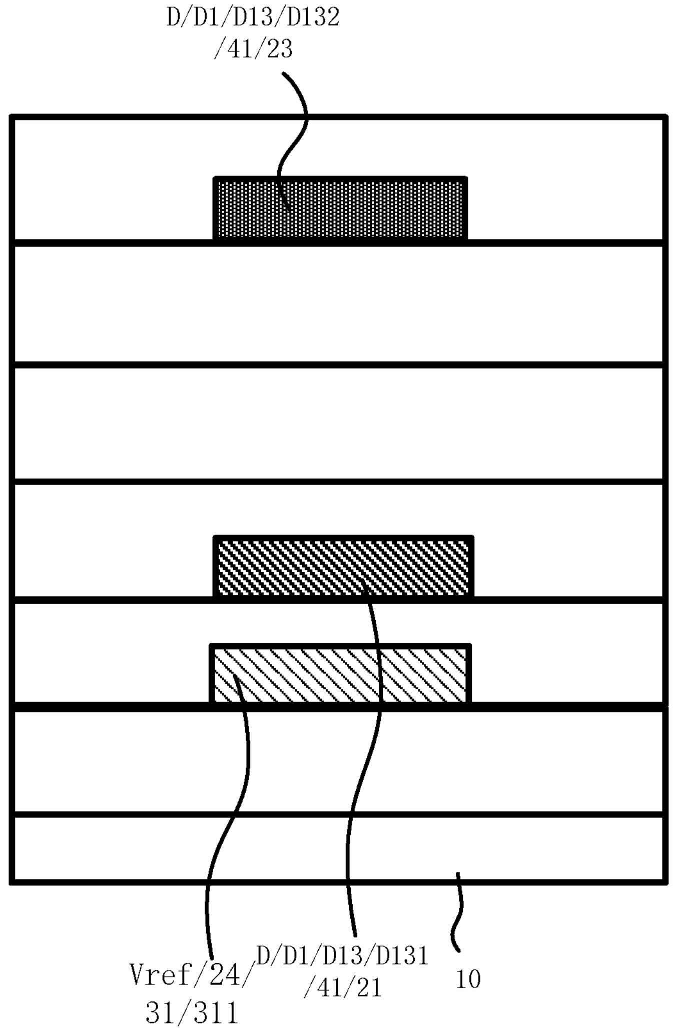
FIG. 9 illustrates a partial structural diagram of a display panel consistent with various embodiments of the present disclosure.

FIG. 8 illustrates another partial layout of a display area in a display panel consistent with various embodiments of the present disclosure. FIG. 9 illustrates a partial structural diagram of a display panel consistent with various embodiments of the present disclosure. Referring to FIGS. 1-3, 8, and 9, in some optional embodiments, along the direction perpendicular to the plane where the display panel is located, the first segments 41 at least partially overlap the first power signal lines 311. That is, spaces occupied by the first power signal lines 311 extending along the second direction Y can be multiplexed to arrange the first segments 41 extending along the second direction Y, so that the first segments 41 can be arranged in the display area AA. The spaces occupied by the first power signal lines 311 are multiplexed to arrange the first segment 41, so that an arrangement of the first segments 41 has less influence on the pixel circuits P10 and other signal lines in the display area AA, effectively reducing an impact on the pixel density of the display panel when the first segments 41 are arranged in the display area AA. At a same time, since the first power signal lines 311 are configured to transmit power supply voltage signals or fixed voltage signals, along the direction perpendicular to the plane where the display panel is located, coupling capacitances formed by overlapping parts of the first segments 41 and the first power signal lines 311 are relatively small, which is conducive to improving a signal crosstalk problem caused when the first segments 41 of the connection lines D13 are arranged in the display area AA, and the display effect of the display panel.

Along the direction perpendicular to the plane where the display panel is located, a first segment 41 of at least one first connection line D131 at least partially overlaps the first segments 41 of the second connection lines D132. The first segments 41 of the first connection lines D131 and the first segments 41 of the second connection lines D132 are on different film layers, so that spaces occupied by the first power signal lines 311 can be multiplexed to arrange the first segments 41 of the first connection lines D131 and the first segments 41 in the second connection lines D132 can be arranged at a same time, and a greater number of first segments 41 can be arranged in a same space. Exemplarily, along the first direction X, when part of the display area AA on a side of the light-transmitting area FA has a relatively small area, spaces occupied by the first power signal lines 311 in the relatively small area can be multiplexed to arrange the first segments 41 of the first connection lines D131 and the first segments 41 of the second connection lines D132 at a same time, so that more connection lines D13 can be arranged in the relatively small area, which is conducive to reducing number of signal lines at frame positions of the light-transmitting area FA, thereby reducing a frame area of the light-transmitting area FA and increasing the screen-to-body ratio of the display panel.

It should be noted that, FIG. 9 exemplarily shows that spaces occupied by the reference voltage signal lines Vref can be multiplexed to simultaneously arrange the first segments 41 of the first connection lines D131 and the first segments 41 of the second connection lines D132. In other embodiments, spaces occupied by other first power signal lines 311 can also be multiplexed to simultaneously arrange the first segments 41 of the first connection lines D131 and the first segments 41 of the second connection line D132. Exemplarily, spaces occupied by the first branch lines PVDD1 can be multiplexed to simultaneously arrange the first segments 41 of the first connection lines D131 and the first segments 41 of the second connection line D132, which is not repeated herein.

Referring to FIGS. 1-3 and 6, in some optional embodiments, along the direction perpendicular to the plane where the display panel is located, the second segments 42 at least partially overlap the second power signal lines 312. That is, spaces occupied by the second power signal lines 312 extending along the first direction X can be multiplexed to arrange the second segments 42 extending along the first direction X, so that the second segments 42 can be arranged in the display area AA. The spaces occupied by the second power signal lines 312 are multiplexed to arrange the second segments 42, so that an arrangement of the second segments 42 has less influence on the pixel circuits P10 and other signal lines in the display area AA, effectively reducing an impact on the pixel density of the display panel when the second segments 42 are arranged in the display area AA. At a same time, since the second power signal lines 312 are configured to transmit power supply voltage signals or fixed voltage signals, so that along the direction perpendicular to the plane where the display panel is located, coupling capacitances formed by overlapping parts of the second segments 42 and the second power signal lines 312 are relatively small, which is conducive to improving a signal crosstalk problem caused when the second segments 42 of the connection lines D13 are arranged in the display area AA, and the display effect of the display panel.

Along the direction perpendicular to the plane where the display panel is located, the second segments 42 of the first connection lines D131 and the second segments 42 of the second connection lines D132 at least partially overlap different second power signal lines 312 respectively. That is, the second segments 42 of the first connection lines D131 and the second segments 42 of the second connection lines D132 can be arranged by multiplexing spaces occupied by different second power signal lines 312, which is conducive to reducing coupling between the second segments 42 of the first connection lines D131 and the second segments 42 of the second connection lines D132, improving a signal crosstalk problem between the second segments 42 of the connection lines D13, and the display effect of the display panel.

Referring to FIGS. 1-3 and 6, in some optional embodiments, the second segments 42 of the first connection lines D131 and the second segments 42 of the second connection lines D132 are arranged alternately.

Specifically, the first connection lines D131 are on the first metal layer 21, and the second connection lines D132 are on the third metal layer 23. Accordingly, the second segments 42 of the first connection lines D131 are on the first metal layer 221 and the second segments 42 of the second connection lines D132 are on the third metal layer 23, so that when the second segments 42 of the first connection lines D131 and the second segments 42 of the second connection lines D132 are arranged alternately, spaces between the second segments 42 of adjacent first connection lines D131 on the first metal layer 21 are relatively large, which is conducive to reducing coupling between the second segments 42 in the adjacent first connection lines D131 on the first metal layer 21, and improving a signal crosstalk problem between the second segments 42 of the adjacent first connection lines D131 on the first metal layer 21, and the display effect of the display panel.

Similarly, distances between the second segments 42 of adjacent second connection lines D132 on the third metal layer 23 are relatively large, which are conducive to reducing coupling between the second segments 42 of the adjacent second connection lines D132 on the third metal layer 23, which is conducive to improving a signal crosstalk problem between the second segments 42 of the adjacent second connection line D132 on the third metal layer 23, and the display effect of the display panel.

Referring to FIGS. 1-3 and 6, in some optional embodiments, the second power signal lines 312 include second branch lines PVDD2 connected to power supply voltage signals.

Specifically, the second branch lines PVDD2 are configured to provide power supply voltage signals to the pixel circuits P10, and at least one second segment 42 at least partially overlaps at least one second branch line PVDD2 along the direction perpendicular to the plane of the display panel. That is, spaces occupied by the second branch lines PVDD2 extending along the first direction X can be multiplexed to arrange the second segments 42 extending along the first direction X, so that the second segments 42 can be arranged in the display area AA. The spaces occupied by the second branch lines PVDD2 are multiplexed to arrange the second segments 42, so that an arrangement of the second segments 42 has less influence on the pixel circuits P10 and other signal lines in the display area AA, effectively reducing an impact on the pixel density of the display panel when the second segments 42 are arranged in the display area AA. At a same time, since the second branch lines PVDD2 are configured to transmit power supply voltage signals, along the direction perpendicular to the plane where the display panel is located, coupling capacitances formed by overlapping part of the second segments 42 and the second branch lines PVDD2 are relatively small, which is conducive to improve a signal crosstalk problem caused when the second segments 42 of the connection lines D13 are arranged in the display area AA, and the display effect of the display panel.

It should be noted that FIG. 6 exemplarily shows that a pixel circuit P10 is electrically connected to a second branch line PVDD2. In other embodiments, the second power signal lines 312 may also include other signal lines. At a same time, spaces occupied by other signal lines for transmitting power supply voltage signals or fixed voltage signals can be multiplexed to arrange the second segments 42, which is not repeated herein.

Figure 10:
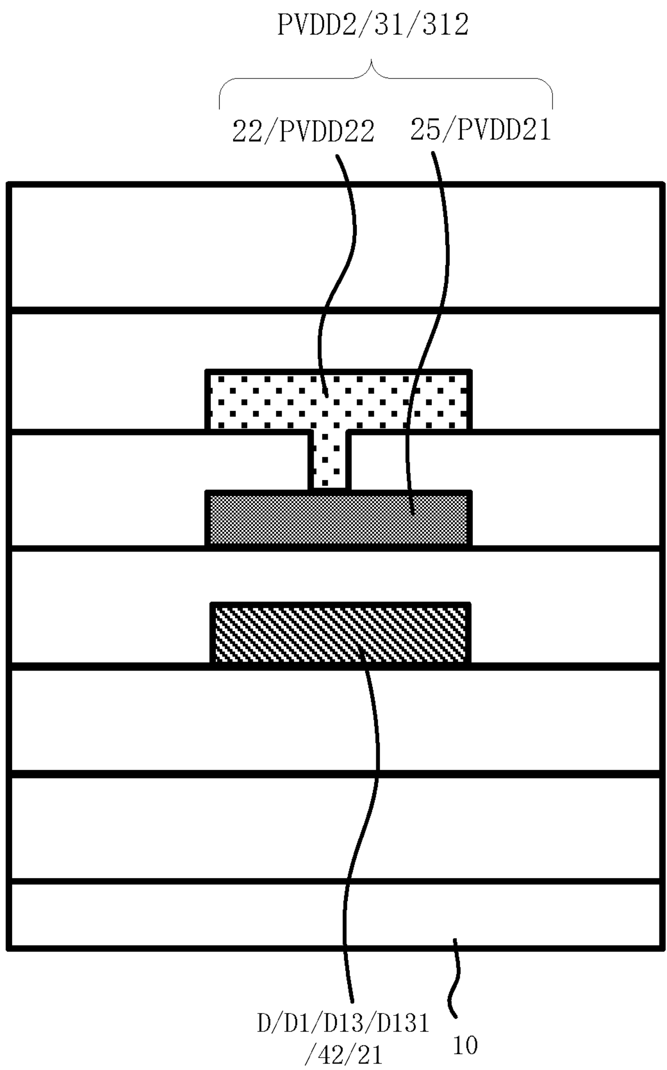
FIG. 10 illustrates another partial structural diagram of a display panel consistent with various embodiments of the present disclosure.

FIG. 10 illustrates another partial structural diagram of a display panel consistent with various embodiments of the present disclosure. Referring to FIGS. 1-3, 6 and 10, in some optional embodiments, the display panel further includes a fifth metal layer 25 between the first metal layer 21 and the second metal layer 22.

A second branch line PVDD2 includes a first part PVDD21 and a second part PVDD22 connected in parallel, the first part PVDD21 is on the fifth metal layer 25, and the second part PVDD22 is on the second metal layer 22. The first connection lines D131 are on the first metal layer 21, and accordingly, the second segments 42 of the first connection lines D131 are on the first metal layer 21, so that the second segments 42 of the first connection lines D131 are insulated from the first parts PVDD21 and the second parts PVDD22 of the second branch lines PVDD2, and spaces occupied by the second branch lines PVDD2 can be multiplexed to arrange the second segments 42 of the first connection lines D131.

Similarly, the second connection lines D132 are on the third metal layer 23, and accordingly, the second segments 42 of the second connection lines D132 are on the third metal layer 23, so that the second segments 42 of the second connection lines D132, the first parts PVDD21 and the second parts PVDD22 of the second branch lines PVDD2 are all insulated from each other, so that spaces occupied by the second branch lines PVDD2 can be multiplexed to arrange the first segments 41 of the second connection lines D132.

It should be noted that, FIG. 10 exemplarily shows that a structure that the second segments 42 of the first connection lines D131 at least partially overlap the second branch lines PVDD2 along the direction perpendicular to the plane where the display panel is located. In other embodiments, along the direction perpendicular to the plane where the display panel is located, the structure that the second segments 42 of the second connection lines D132 at least partially overlap the second branch lines PVDD2 can refer to FIG. 10, which is not repeated herein.

Figure 11:
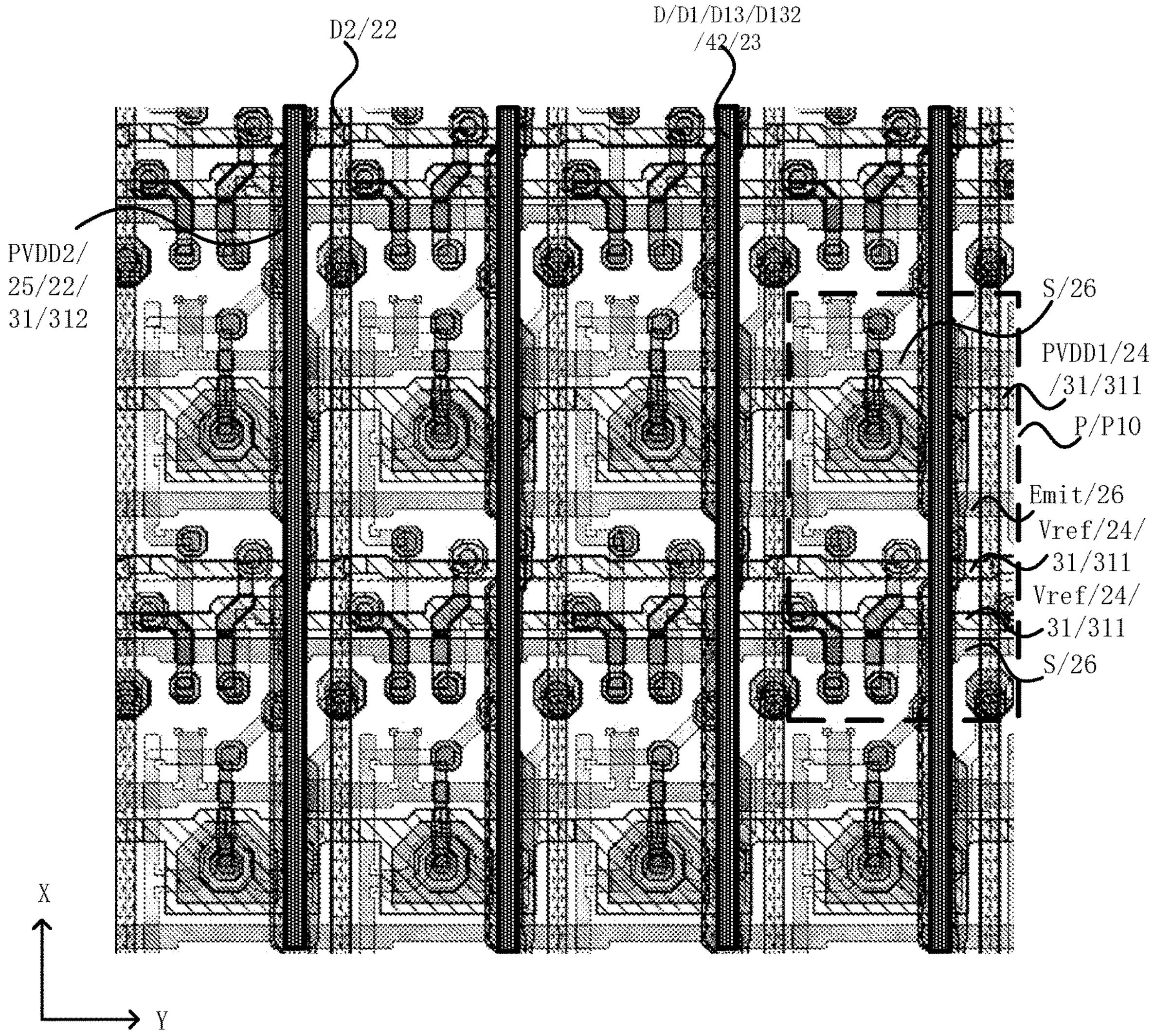
FIG. 11 illustrates another partial layout of a display area in a display panel consistent with various embodiments of the present disclosure.
Figure 12:
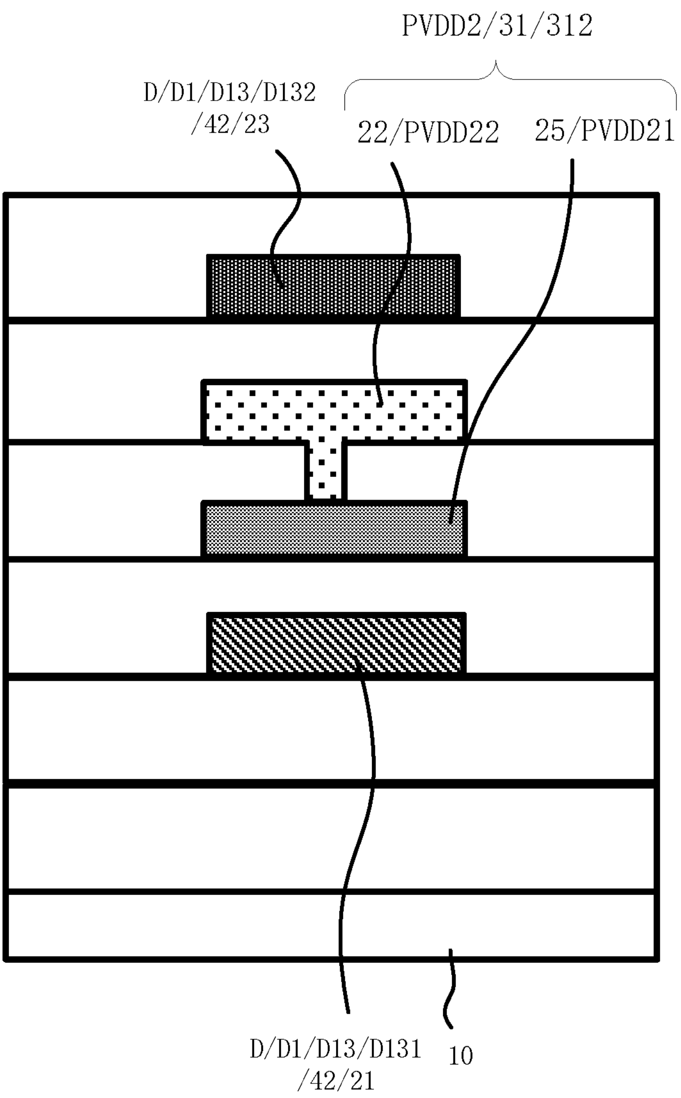
FIG. 12 illustrates another partial structural diagram of a display panel consistent with various embodiments of the present disclosure.

FIG. 11 illustrates another partial layout of a display area in a display panel consistent with various embodiments of the present disclosure. FIG. 12 illustrates another partial structural diagram of a display panel consistent with various embodiments of the present disclosure. Referring to FIGS. 1-3, 11 and 12, in some optional embodiments, along the direction perpendicular to the plane where the display panel is located, the second segments 42 at least partially overlap the second power signal lines 312. That is, spaces occupied by the second power signal lines 312 extending along the first direction X can be multiplexed to arrange the second segments 42 extending along the first direction X, so that the second segments 42 can be arranged in the display area AA. The spaces occupied by the second power signal lines 312 are multiplexed to arrange the second segment 42, so that an arrangement of the second segment 42 has less influence on the pixel circuits P10 and other signal lines in the display area AA, effectively reducing an impact on the pixel density of the display panel when the second segments 42 are arranged in the display area AA. At a same time, since the second power signal lines 312 are configured to transmit power voltage signals or fixed voltage signals, so that along the direction perpendicular to the plane where the display panel is located, coupling capacitances formed by overlapping parts of the second segments 42 and the second power signal lines 312 are relatively small, which is conducive to improving a signal crosstalk problem caused when the second segments 42 of the connection lines D13 are arranged in the display area AA, and the display effect of the display panel.

Along the direction perpendicular to the plane where the display panel is located, a second segment 42 of the at least one first connection line D131 at least partially overlaps the second segments 42 of the second connection lines D132. The second segments 42 of the first connection lines D131 and the second segments 42 of the second connection lines D132 are on different film layers, so that spaces occupied by the second power signal lines 312 can be multiplexed to simultaneously arrange the second segments 42 of the first connection lines D131 and the second segments 42 of the second connection lines D132, and a greater number of second segments 42 can be arranged in a same space. Exemplarily, along the second direction Y, when part of the display area AA on a side of the light-transmitting area FA has a relatively small area, so that spaces occupied by the second power signal lines 312 in the relatively small area can be multiplexed to simultaneously arrange the second segments 42 of the first connection lines D131 and the second segments 42 of the second connection lines D132, and more connection lines D13 in the relatively small area can be arranged, which is conducive to reducing number of signal lines at a frame position of the light-transmitting area FA, thereby reducing a frame area of the light-transmitting area FA and increasing the screen-to-body ratio of the display panel.

A second branch line PVDD2 includes a first part PVDD21 and a second part PVDD22 connected in parallel, the first parts PVDD21 are on the fifth metal layer 25, and the second parts PVDD22 are on the second metal layer 22. The first connection lines D131 are on the first metal layer 21, the second connection lines D132 are on the third metal layer 23, the fifth metal layer 25 and the second metal layer 22 are between the first metal layer 21 and the third metal layer 23. The second branch lines PVDD2 are configured to provide power supply voltage signals to the pixel circuits P10, and the second branch lines PVDD2 can shield the first connection lines D131 and the second connection lines D132 corresponding to the second branch lines PVDD2, so that when spaces occupied by the second branch lines PVDD2 are multiplexed to simultaneously arrange the second segments 42 of the first connection lines D131 and the second segments 42 of the second connection lines D132, couplings between the second segments 42 of the first connection lines D131 and the second segments 42 of the second connection lines D132 that are oppositely arranged are effectively reduced, which is conducive to improving the display effect of the display panel.

It should be noted that FIG. 12 exemplarily shows that the spaces occupied by the second branch lines PVDD2 can be multiplexed to simultaneously arrange the second segments 42 of the first connection lines D131 and the second segments 42 of the second connection lines D132. In other embodiments, spaces occupied by other second power signal lines 312 can also be multiplexed to simultaneously arrange the second segments 42 of the first connection lines D131 and the second segments 42 of the second connection lines D132, which is not repeated herein.

Figure 13:
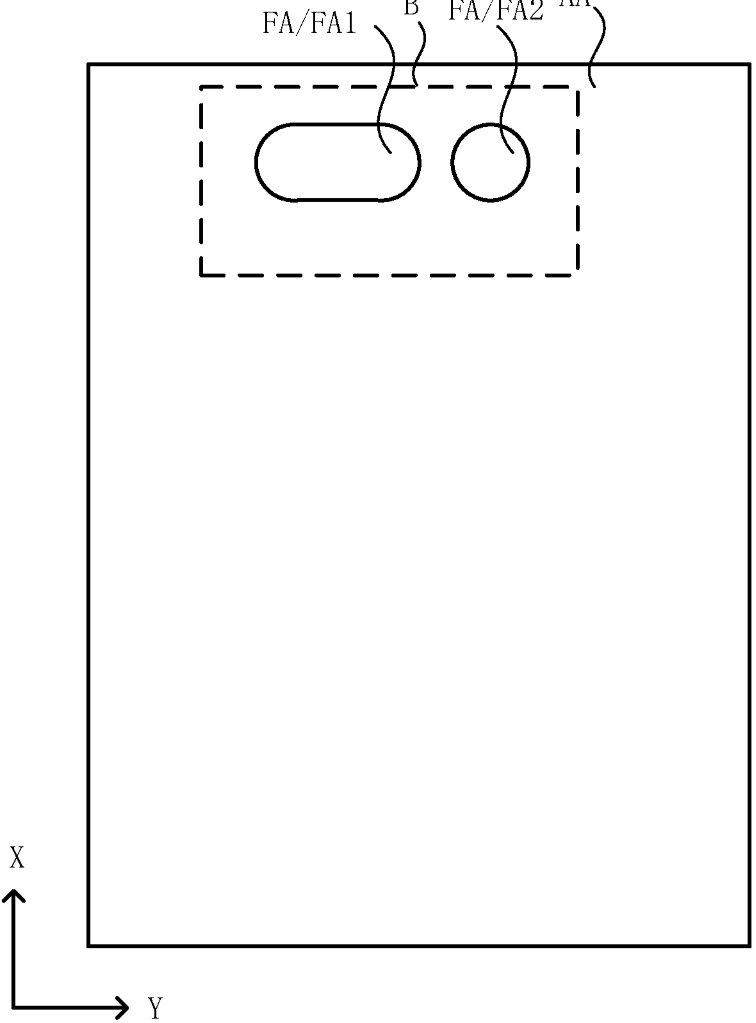
FIG. 13 illustrates another planar view of a display panel consistent with various embodiments of the present disclosure.
Figure 14:
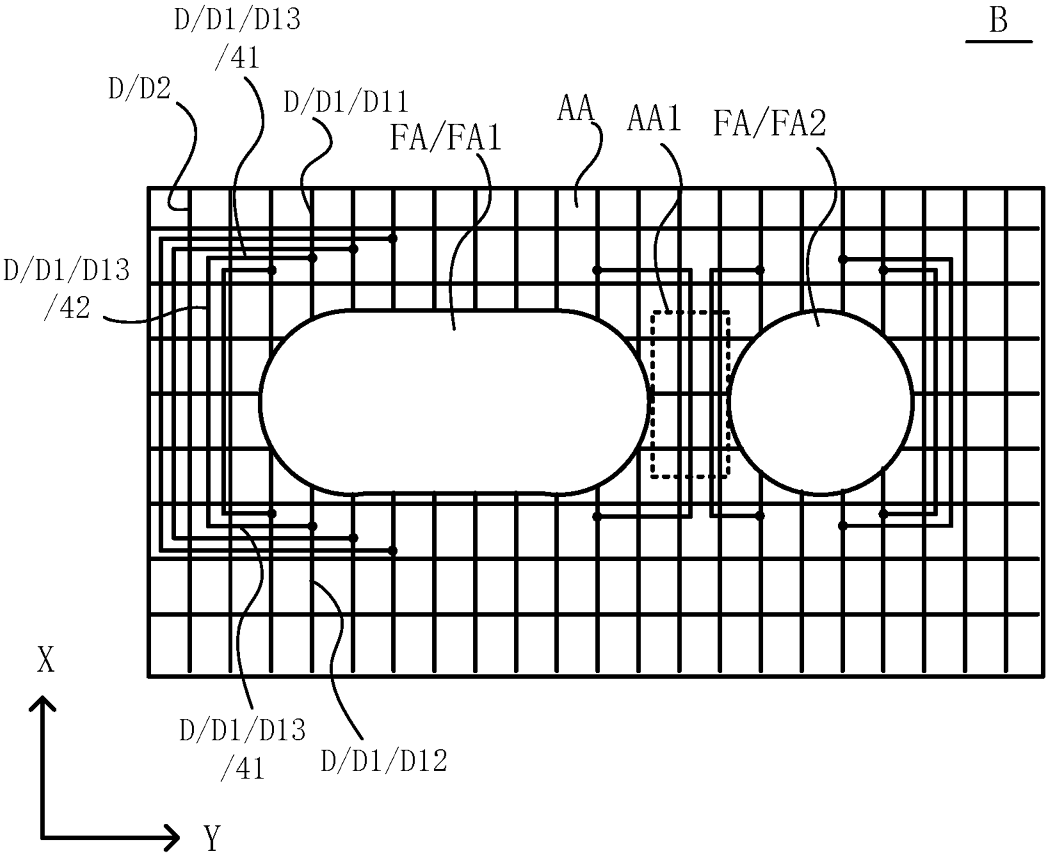
FIG. 14 illustrates an enlarged schematic diagram of part B of the display panel described in FIG. 13.

FIG. 13 illustrates another planar view of a display panel consistent with various embodiments of the present disclosure. FIG. 14 illustrates an enlarged schematic diagram of part B of the display panel described in FIG. 13. Referring to FIG. 13 and FIG. 14, in some optional embodiments, the display panel includes at least two light-transmitting areas FA, which is conducive to arranging more photosensitive elements, so that the display panel has more functions.

There are at least two light-transmitting areas FA arranged along the second direction Y. The display area AA includes a first display area AA1 between two consecutive light-transmitting areas FA, and part of the connection lines D13 is in the first display area AA1. Since the first subsections D11 and the second subsections D12 of the first data lines D1 are respectively on two sides of the light-transmitting areas FA along the first direction X, the connection lines D13 connecting the first subsections D11 and the second subsections D12 partially surround the light-transmitting areas FA. The connection lines D13 are in the display area AA, and part of the connection lines D13 may be partially in the first display area AA1 between two adjacent light-transmitting areas FA1 and FA2, thereby reducing number of signal lines at a frame position of the light-transmitting area FA1 and at a frame position of the light-transmitting area FA2, reducing frame areas of the light-transmitting area FA1 and the light-transmitting area FA2 and improving the screen-to-body ratio of the display panel.

Optionally, part of the connection lines D13 may be on a side of the light-transmitting area FA1 away from the light-transmitting area FA2, part of the connection line D13 may be on a side of the light-transmitting area FA2 away from the light-transmitting area FA1, and the connection lines D13 are in the display area AA, which can further reduce number of signal lines at a frame position of the light-transmitting area FA1 and a frame position of the light-transmitting area FA2, thereby reducing frame areas of the light-transmitting area FA1 and the light-transmitting area FA2 and improving the screen-to-body ratio of the display.

It should be noted that FIG. 13 and FIG. 14 exemplarily show that the display panel includes two light-transmitting areas FA. In other embodiments, the display panel may also include other numbers of light-transmitting areas, and an arrangement of the connection lines D13 may be arranged with reference to the above embodiments, which is not repeated herein.

Referring to FIG. 13 and FIG. 14, in some optional embodiments, two adjacent light-transmitting areas FA are the first light-transmitting area FA1 and the second light-transmitting area FA2 respectively. A length of the first light-transmitting area FA1 along the second direction Y is greater than a width of the first light-transmitting area FA along the first direction X, and a length of the second light-transmitting area FA2 along the second direction Y is smaller than a length of the first light-transmitting area FA1 along the second direction Y. That is, the first light-transmitting area FA1 extends along the second direction Y and the length of the light-transmitting area FA1 along the second direction Y is longer, so that number of data lines D partially intercepted by the light-transmitting area FA1 is relatively large and number of winding lines at the frame position of the light-transmitting area FA1 is relatively large. When the light-transmitting area FA1 is designed to extend along the second direction Y, part of the data lines D intercepted by the light-transmitting area FA1 can at least partially adopt a design of the first data lines D1, that is, the first subsections D11 and the second subsections D12 are respectively on two sides of the light-transmitting area FA along the first direction X, and the connection lines D13 connecting the first subsections D11 and the second subsections D12 partially surrounds the light-transmitting area FA1. The connection lines D13 is in the display area AA, that is, the connection line D13 does not need to be wound from the frame position of the light-transmitting area FA1, which can effectively reduce number of signal lines at the frame position of the light-transmitting area FA1, effectively reduce the frame area of the light-transmitting area FA1 and increase the screen-to-body ratio of the display panel.

It should be noted that FIG. 13 and FIG. 14 exemplarily show only one light-transmitting area FA1 in the display panel, and the light-transmitting area FA1 is an ellipse extending along the second direction Y. In other embodiments, a person skilled in the art can arrange shape, position and quantity of the light-transmitting areas FA extending along the second direction Y according to actual needs, which is not specifically limited herein.

Figure 15:
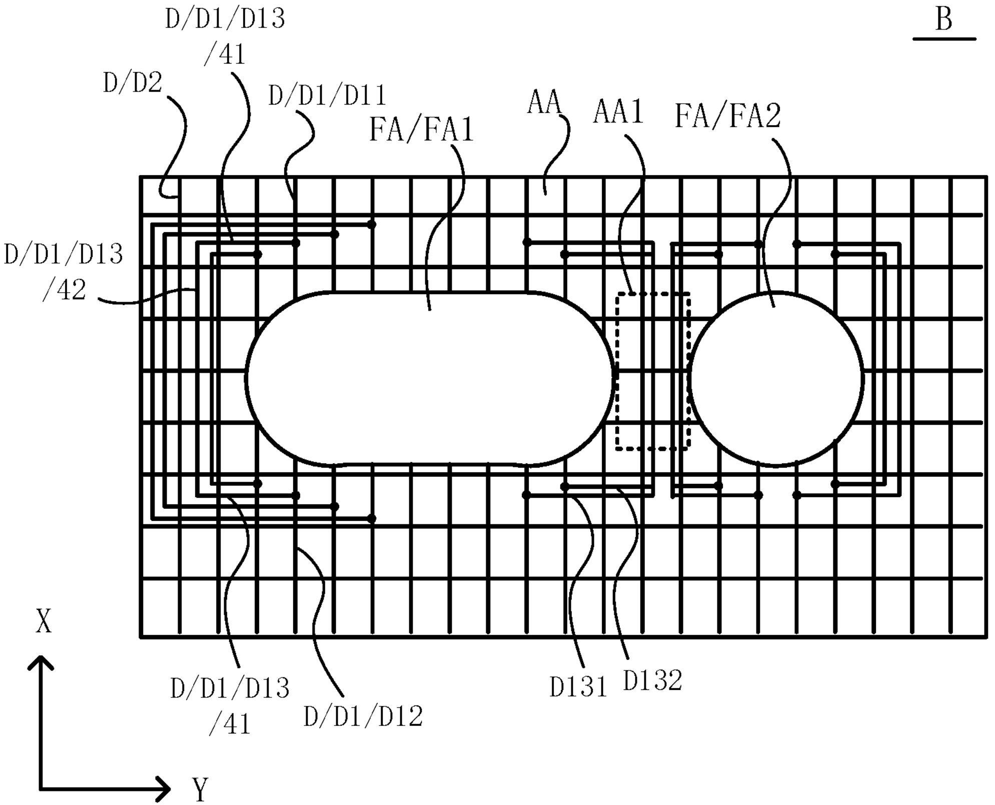
FIG. 15 illustrates another enlarged schematic diagram of part B of the display panel described in FIG. 13.

FIG. 15 illustrates another enlarged schematic diagram of part B of the display panel described in FIG. 13. Referring to FIGS. 11-13 and 15, in some optional embodiments, a length of the first display area AA1 along the second direction Y is smaller than a length of the second light-transmitting area FA1 along the second direction Y. That is, the length of the first display area AA1 along the second direction Y is relatively small and a space of the first display area AA1 between the first light-transmitting area FA1 and the second light-transmitting area FA2 along the second direction Y is relatively small.

In the first display area AA1, along the direction perpendicular to the plane where the display panel is located, at least one second segment 42 of the first connection line D131 at least partially overlaps the second segments 42 of the second connection lines D132.

Specifically, since the space of the first display area AA1 between the first light-transmitting area FA1 and the second light-transmitting area FA2 along the second direction Y is relatively small, in the first display area AA1, spaces occupied by the second power signal lines 312 can be multiplexed to simultaneously arrange the second segments 42 of the first connection lines D131 and the second segments 42 of the second connection lines D132, so that more connection lines D13 can be arranged in the first display area AA1, which is conducive to reducing number of signal lines at frame positions of the light-transmitting areas FA, thereby reducing frame areas of the light-transmitting areas FA and increasing the screen-to-body ratio of the display panel.

Figure 16:
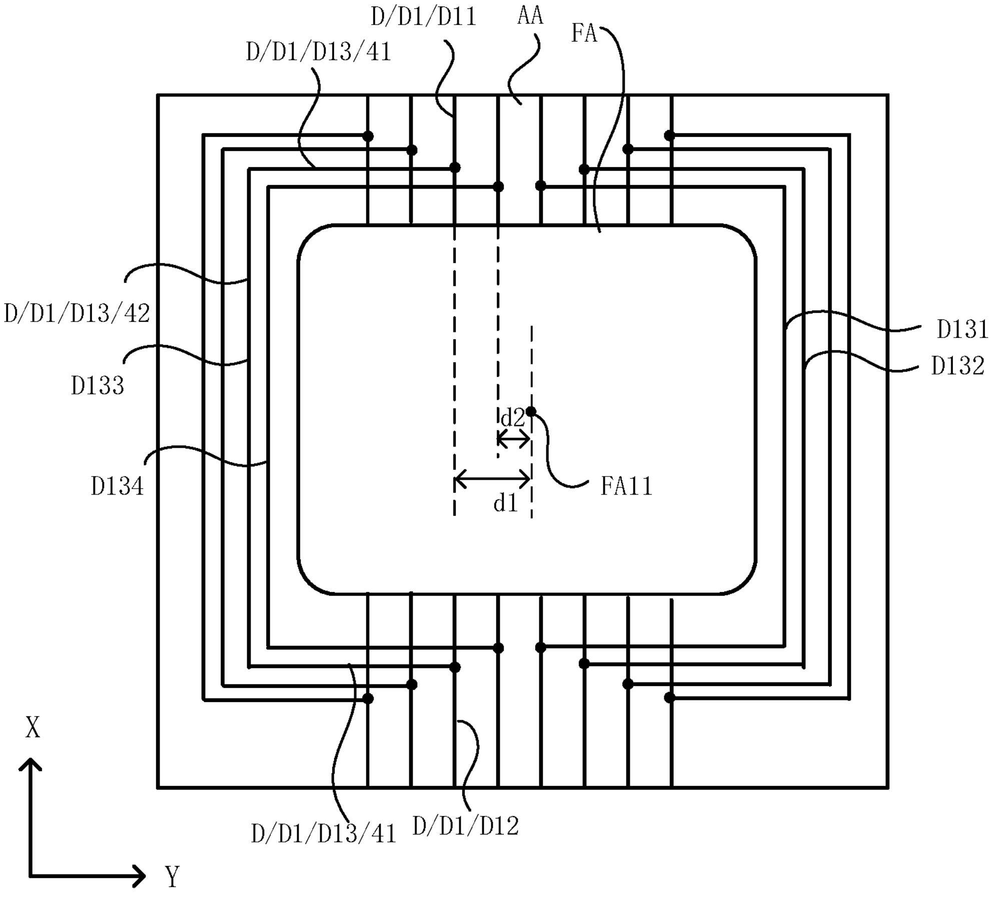
FIG. 16 illustrates another partial planar view of a display panel consistent with various embodiments of the present disclosure.

FIG. 16 illustrates another partial planar view of a display panel consistent with various embodiments of the present disclosure. Referring to FIG. 16, in some optional embodiments, connection lines D13 include third connection lines D133 and fourth connection lines D134. A third connection line D133 and a fourth connection line D134 surround a same light-transmitting area FA. A distance between the third connection line D133 and a center FA11 of the light-transmitting area FA along the second direction Y is greater than a distances between the fourth connection lines D134 and the center FA11 of the light-transmitting area FA along the second direction Y. A distance between the third connection line D133 and the center FA11 of the light-transmitting area FA along the first direction X is greater than a distance between the fourth connection line D134 and the center FA11 of the light-transmitting area FA along the first direction X. A distance between a first subsection D11 connected to the third connection line D133 and the center FA11 of the light-transmitting area FA along the second direction Y is d1, a distance between the first subsection D11 connected to the fourth connection line D134 and the center FA11 of the light-transmitting area FA along the second direction Y is d2, and d1>d2.

Specifically, two connection lines D13 surrounding a same light-transmitting area FA are the third connection line D133 and the fourth connection line D134 respectively. The distance between the third connection line D133 and the center FA11 of the light-transmitting area FA along the second direction Y is greater than the distance between the fourth connection line D134 and the center FA11 of the light-transmitting area FA along the second direction Y. The distance between the third connection line D133 and the center FA11 of the light-transmitting area FA along the first direction X is greater than the distance between the fourth connection line D134 and the center FA11 of the light-transmitting area FA along the first direction X. That is, in the first direction X and the second direction Y, the distance between the third connection line D133 and the center FA11 of the light-transmitting area FA is greater than the distance between the fourth connection line D134 and the center FA11 of the light-transmitting area FA, and compared with the fourth connection line D134, the third connection line D133 is farther away from the light-transmitting area FA.

The distance between the first subsection D11 connected to the third connection line D133 and the center FA11 of the light-transmitting area FA along the second direction Y is greater than the distance between the first subsection D11 connected to the fourth connection line D134 and the center FA11 of the light-transmitting area FA the distance along the second direction Y. Similarly, a distance between the second subsection D12 connected to the third connection line D133 and the center FA11 of the light-transmitting area FA along the second direction Y is greater than a distance between the second subsection D12 connected to the fourth connection line D134 and the center FA11 of the light-transmitting area FA the distance along the second direction Y, so that lengths of the third connection line D133 and the fourth connection line D134 tend to be same, and lengths of different first data lines D1 tend to be the same, which is conducive to improving the display effect.

It should be noted that a naming of the third connection line D133 and the fourth connection line D134 is convenient for describing a positional relationship between the two connection lines D13, but not limit specific two connection lines D13. A connection line D13 which is the third connection line D133 in the embodiment may be the fourth connection line D134 in other embodiments. Similarly, a connection line D13 which is the fourth connection line D134 in the embodiment can be the third connection line D133 in other embodiments, which is not repeated herein.

It can be understood that the center FA11 of the light-transmitting area FA is a geometric center of the light-transmitting area FA.

Figure 17:
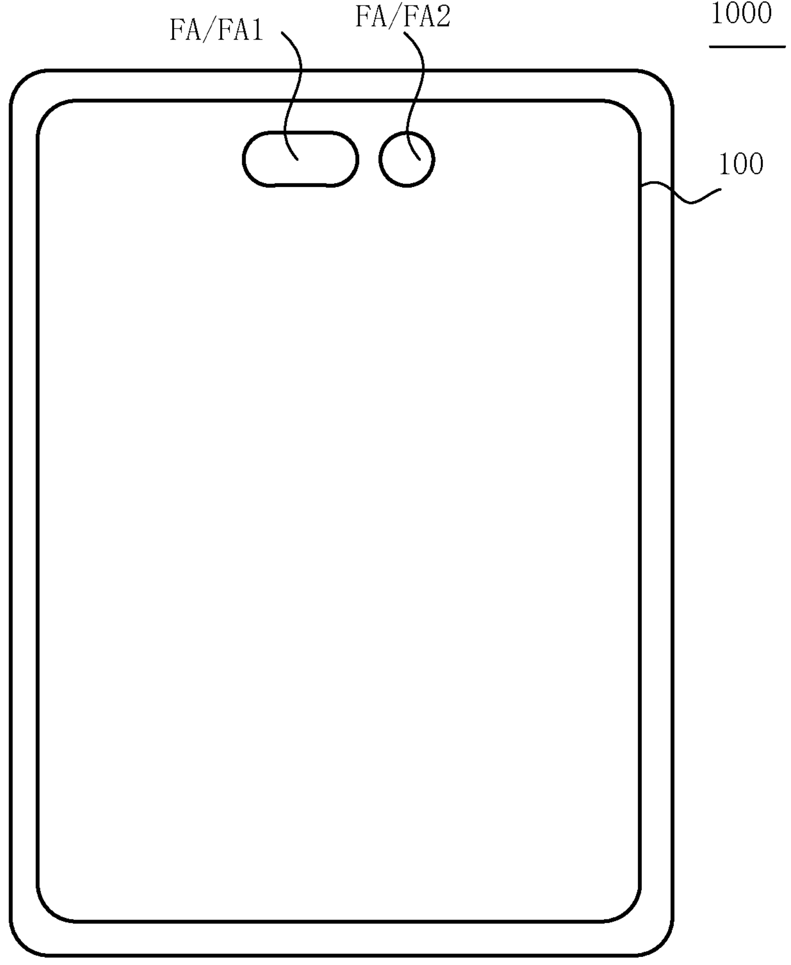
FIG. 17 illustrates a schematic diagram of a display device consistent with various embodiments of the present disclosure.

FIG. 17 illustrates a schematic diagram of a display device consistent with various embodiments of the present disclosure. In one embodiment, a display device 1000 includes the display panel 100 provided in the above embodiments. The embodiment in FIG. 17 only takes a mobile phone as an example to illustrate the display device 1000. It can be understood that the display device 1000 provided in the embodiment may also be a display device 1000 with a display function such as a computer, a television, a vehicle-mounted display device or the like, which is not specifically limited herein. The display device 1000 provided in the embodiment has beneficial effects of the display panel 100 provided in the above embodiment. For details, reference may be made to specific descriptions of the display panel 100 in the above embodiments, which is not repeated herein.

As disclosed, the display panel and the display device provided by the present disclosure at least realize the following beneficial effects.

In the display panel provided by the present disclosure, the display area includes a plurality of data lines including first data lines. A first data line includes a first subsection, a second subsection, and a connection line connecting the first subsection and the second subsection. The first subsection and the second subsection are respectively on two sides of a light-transmitting area along the first direction, the first subsection and the second subsection extend to an end of the light-transmitting area, and the first subsection and the second subsection are connected by arranging a connection line. That is, virtual extension lines of the first subsection and the second subsection extend through the light-transmitting area. The connection line partially surrounds the light-transmitting area in the display area. That is, the connection line does not need to be wound from a border of the light-transmitting area, thereby reducing number of signal lines at a frame position of the light-transmitting area, reducing a frame area of the light-transmitting area and increasing a screen-to-body ratio of the display panel. Connection lines include first connection lines and second connection lines on different film layers. That is, the first connection lines and the second connection lines are respectively arranged on different film layers of the display panel, which is conducive to arranging more connection lines in the display area, reducing number of signal lines at the frame position of the light-transmitting area, and reducing the frame area of the light-transmitting area and increasing the screen-to-body ratio of the display panel. At a same time, the first connection lines and the second connection lines are on different film layers, which is conducive to reducing number of connection lines on a same film layer, increasing spaces between adjacent connection lines arranged on the same film layer, reducing coupling capacitances formed between adjacent connection lines arranged on the same film layer, improving a signal crosstalk problem between adjacent connection lines arranged on the same film layer and the display effect of the display panel.

Although specific embodiments of the present disclosure have been described in detail by way of examples, a person skilled in the art should understand that the above embodiments are for illustration only, rather than limiting the scope of the present disclosure. A person skilled in the art can make modifications without departing from the scope and spirit of the present disclosure. The scope of the present disclosure is defined by the appended claims.

What is claimed is:

1. A display panel comprising:

at least one light-transmitting area and a display area surrounding the at least one light-transmitting area, wherein:

the display area includes a plurality of data lines including first data lines, a first data line includes a first subsection, a second subsection, and a connection line connecting the first subsection and the second subsection, first subsections and second subsections are respectively on two sides of a light-transmitting area of the at least one light-transmitting area along a first direction, connection lines at least partially surround the light-transmitting area, and the connection lines are in the display area;

the connection line includes a first connection line and a second connection line on different film layers;

a base substrate, and a first metal layer, a second metal layer, and a third metal layer sequentially arranged above the base substrate, wherein the first subsection and the second subsection are on the second metal layer, first connection lines are on the first metal layer, and second connection lines are on the third metal layer;

a plurality of first branch lines connected to power supply voltage signals and a plurality of second branch lines connected to power voltage signals; and a fifth metal layer between the first metal layer and the second metal layer, wherein a second branch line includes a first part and a second part connected in parallel, the first part is on the fifth metal layer, and the second part is on the second metal layer.

2. The display panel according to claim 1, wherein:

the display area includes a plurality of pixel circuits and a plurality of signal lines electrically connected to the plurality of pixel circuits; and the plurality of signal lines includes power signal lines, and at least one connection line at least partially overlaps the power signal lines along a direction perpendicular to a plane where the display panel is located.

3. The display panel according to claim 2, wherein:

a connection line includes two first segments extending along a second direction and a second segment extending along the first direction, the two first segments are electrically connected to a first subsection and a second subsection respectively, the two first segments are respectively connected to two ends of the second segment and the first direction intersects the second direction;

the power signal lines include first power signal lines and second power signal lines, the first power signal lines extend along the second direction, and the second power signal lines extend along the first direction; and along the direction perpendicular to the plane where the display panel is located, at least one first segment at least partially overlaps the first power signal lines, or, at least one second segment at least partially overlaps the second power signal lines.

4. The display panel according to claim 3, wherein:

along the direction perpendicular to the plane where the display panel is located, the first segments at least partially overlap the first power signal lines; and along the direction perpendicular to the plane where the display panel is located, the first segments of the first connection lines and the first segments of the second connection lines at least partially overlap different first power signal lines.

5. The display panel according to claim 4, wherein the first segments of the first connection lines and the first segments of the second connection lines are arranged alternately.

6. The display panel according to claim 4, wherein the first power signal lines include reference voltage signal lines and the first branch lines connected to the power supply voltage signals.

7. The display panel according to claim 6, further comprising a fourth metal layer between the base substrate and the first metal layer, wherein:

both the reference voltage signal lines and the first branch lines are on the fourth metal layer.

8. The display panel according to claim 7, wherein the first segments are electrically connected to the first subsections or the second subsections through via holes, and a vertical projection of a via hole on a plane where the base substrate is located is within a vertical projection of a reference voltage signal line or a first branch line on the plane where the base substrate is located.

9. The display panel according to claim 3, wherein:

along the direction perpendicular to the plane where the display panel is located, the first segments at least partially overlap the first power signal lines; and along the direction perpendicular to the plane where the display panel is located, a first segment of at least one first connection line at least partially overlaps the first segments of the second connection lines.

10. The display panel according to claim 3, wherein:

along the direction perpendicular to the plane where the display panel is located, the second segments at least partially overlap the second power signal lines; and along the direction perpendicular to the plane where the display panel is located, the second segments of the first connection lines and the second segments of the second connection lines at least partially overlap different second power signal lines respectively.

11. The display panel according to claim 10, wherein the second segments of the first connection lines and the second segments of the second connection lines are arranged alternately.

12. The display panel according to claim 10, wherein:

the second power signal lines include the second branch lines connected to the power supply voltage signals.

13. The display panel according to claim 10, wherein:

along the direction perpendicular to the plane where the display panel is located, at least one second segment of the first connection lines at least partially overlaps the second segments of the second connection lines.

14. The display panel according to claim 13, further comprising at least two light-transmitting areas arranged along the second direction, wherein:

the display area includes a first display area between two adjacent light-transmitting areas; and part of the connection lines is in the first display area.

15. The display panel according to claim 14, wherein:

the two adjacent light-transmitting areas are respectively a first light-transmitting area and a second light-transmitting area, a length of the first light-transmitting area along the second direction is greater than a width of the first light-transmitting area along the first direction, and a length of the second light-transmitting area along the second direction is smaller than a length of the first light-transmitting area along the second direction.

16. The display panel according to claim 15, wherein:

a length of the first display area along the second direction is smaller than the length of the second light-transmitting area along the second direction; and in the first display area, along the direction perpendicular to the plane where the display panel is located, a second segment of at least one first connection lines at least partially overlaps the second segments of the second connection lines.

17. The display panel according to claim 2, wherein:

the connection lines include third connection lines and fourth connection lines, and the third connection lines and the fourth connection lines surround a same light-transmitting area;

a distance between a third connection line and a center of the same light-transmitting area along the second direction is greater than a distance between a fourth connection line and a center of the same light-transmitting area along the second direction;

a distance between the third connection line and the center of the light-transmitting area along the first direction is greater than a distance between the fourth connection line and the center of the light-transmitting area along the first direction; and a distance between a first subsection connected to the third connection line and the center of the light-transmitting area along the second direction is d1, a distance between a first subsection connected to the fourth connection line and the center of the light-transmitting area along the second direction is d2, and d1>d2.

18. The display panel according to claim 1, wherein:

the display area includes a plurality of subpixels including electrically connected pixel circuits and light emitting elements;

the display panel also includes a plurality of scanning lines, a plurality of light emission control signal lines, and a plurality of reference voltage signal lines, and the plurality of scanning lines, the plurality of light emission control signal lines, the plurality of reference voltage signal lines and the plurality of first branch lines all extend along the second direction;

the plurality of second branch lines extends along the first direction;

the pixel circuits are electrically connected to the plurality of scanning lines, the plurality of data lines, the plurality of light emission control signal lines, the plurality of reference voltage signal lines, the plurality of first branch lines and the plurality of second branch lines;

the display panel further includes a fourth metal layer and a sixth metal layer, the sixth metal layer is on a side of the first metal layer close to the base substrate, and the fourth metal layer is between the first metal layer and the sixth metal layer; and the plurality of light emission control signal lines and the plurality of scanning lines are on the sixth metal layer, and the plurality of reference voltage signal lines and the plurality of first branch lines are on the fourth metal layer.

* * * * *